(12) United States Patent
Bagschik et al.

(10) Patent No.: US 11,625,513 B2
(45) Date of Patent: Apr. 11, 2023

(54) SAFETY ANALYSIS FRAMEWORK

(71) Applicant: Zoox, Inc., Foster City, CA (US)

(72) Inventors: Gerrit Bagschik, Foster City, CA (US); Andrew Scott Crego, Foster City, CA (US); Antoine Ghislain Deux, Seattle, WA (US); Rodin Lyasoff, Mountain View, CA (US); James William Vaisey Philbin, Palo Alto, CA (US); Marc Wimmershoff, San Jose, CA (US); Andreas Christian Reschka, Foster City, CA (US); Ashutosh Gajanan Rege, San Jose, CA (US)

(73) Assignee: Zoox, Inc., Foster City, CA (US)

( * ) Notice: Subject to any disclaimer, the term of this patent is extended or adjusted under 35 U.S.C. 154(b) by 385 days.

(21) Appl. No.: 16/586,838

(22) Filed: Sep. 27, 2019

(65) Prior Publication Data

US 2021/0097148 A1 Apr. 1, 2021

(51) Int. Cl.
*G06F 30/20* (2020.01)
*G05D 1/00* (2006.01)

(52) U.S. Cl.
CPC .......... *G06F 30/20* (2020.01); *G05D 1/0088* (2013.01); *G05D 2201/0213* (2013.01)

(58) Field of Classification Search
CPC .............................. G06F 30/20; G05D 1/0088
USPC .......................................................... 703/8
See application file for complete search history.

(56) References Cited

U.S. PATENT DOCUMENTS

| 9,836,895 B1 * | 12/2017 | Nygaard | G05D 1/0088 |
| 9,910,441 B2 * | 3/2018 | Levinson | G05D 1/0214 |
| 9,958,864 B2 * | 5/2018 | Kentley-Klay | G07C 5/00 |
| 10,026,506 B1 * | 7/2018 | LaBorde | G06N 3/08 |
| 10,169,680 B1 * | 1/2019 | Sachdeva | G06T 7/174 |
| 10,228,693 B2 * | 3/2019 | Micks | G05D 1/0088 |

(Continued)

FOREIGN PATENT DOCUMENTS

| DE | 102014215980 A1 | 2/2016 |
| DE | 102016009762 A1 | 2/2018 |
| WO | WO2019108985 A1 | 6/2019 |

OTHER PUBLICATIONS

Mitra et al. (Towards Modeling of Perception Errors in Autonomous Vehicles, IEEE, 2018, pp. 3024-3029) (Year: 2018).*

(Continued)

*Primary Examiner* — Iftekhar A Khan

(74) *Attorney, Agent, or Firm* — Lee & Hayes, P.C.

(57) ABSTRACT

Techniques for determining a safety metric associated with a vehicle controller are discussed herein. To determine whether a complex system (which may be uninspectable) is able to operate safely, various operating regimes (scenarios) can be identified based on operating data and associated with a scenario parameter to be adjusted. To validate safe operation of such a system, a scenario may be identified for inspection. Error metrics of a subsystem of the system can be quantified. The error metrics, in addition to stochastic errors of other systems/subsystems can be introduced to the scenario. The scenario parameter may also be perturbed. Any multitude of such perturbations can be instantiated in a simulation to test, for example, a vehicle controller. A safety metric associated with the vehicle controller can be determined based on the simulation, as well as causes for any failures.

20 Claims, 9 Drawing Sheets

(56) References Cited

U.S. PATENT DOCUMENTS

| | | | |
|---|---|---|---|
| 10,373,259 B1* | 8/2019 | Konrardy | G06Q 40/08 |
| 10,481,044 B2* | 11/2019 | Sun | B60W 30/00 |
| 10,816,978 B1* | 10/2020 | Schwalb | G08G 1/0129 |
| 11,126,180 B1* | 9/2021 | Kobilarov | B60W 30/095 |
| 11,164,369 B2* | 11/2021 | Hu | G01S 13/862 |
| 2012/0059621 A1 | 3/2012 | Kotzor et al. | |
| 2017/0123421 A1* | 5/2017 | Kentley | G06Q 10/00 |
| 2017/0123422 A1* | 5/2017 | Kentley | B60L 15/20 |
| 2017/0124476 A1* | 5/2017 | Levinson | G06V 20/58 |
| 2017/0132334 A1* | 5/2017 | Levinson | G01S 17/931 |
| 2017/0132934 A1* | 5/2017 | Kentley | G08G 1/202 |
| 2017/0147722 A1* | 5/2017 | Greenwood | G06N 3/126 |
| 2017/0286570 A1 | 10/2017 | Kim et al. | |
| 2017/0357862 A1 | 12/2017 | Tatsubori | |
| 2018/0203445 A1* | 7/2018 | Micks | G06F 30/20 |
| 2018/0336297 A1 | 11/2018 | Sun et al. | |
| 2018/0341887 A1* | 11/2018 | Kislovskiy | G08G 1/202 |
| 2018/0356819 A1* | 12/2018 | Mahabadi | B60W 30/08 |
| 2019/0049968 A1* | 2/2019 | Dean | A61G 5/04 |
| 2019/0050308 A1 | 2/2019 | Chaudhari et al. | |
| 2019/0050653 A1 | 2/2019 | Natroshvili | |
| 2019/0179979 A1 | 6/2019 | Melick | |
| 2019/0188862 A1 | 6/2019 | Natroshvili | |
| 2020/0026287 A1 | 1/2020 | Jiang et al. | |
| 2020/0090192 A1* | 3/2020 | Sim | H04W 4/025 |
| 2020/0107154 A1* | 4/2020 | Kam | G06N 3/084 |
| 2020/0111011 A1* | 4/2020 | Viswanathan | G01C 21/005 |
| 2020/0151291 A1* | 5/2020 | Bhattacharyya | G01C 21/203 |
| 2020/0151798 A1* | 5/2020 | Sim | G06F 40/279 |
| 2020/0158862 A1* | 5/2020 | Mahmoud | G01S 13/931 |
| 2020/0307562 A1* | 10/2020 | Ghafarianzadeh | G06N 20/00 |
| 2020/0307563 A1* | 10/2020 | Ghafarianzadeh | G06V 20/58 |
| 2020/0370920 A1* | 11/2020 | Ahmed | G01S 13/89 |
| 2020/0410853 A1* | 12/2020 | Akella | G08G 1/04 |
| 2021/0053570 A1* | 2/2021 | Akella | B60W 50/00 |
| 2021/0094538 A1* | 4/2021 | Beller | B60W 30/0956 |
| 2021/0094540 A1* | 4/2021 | Bagschik | G06F 11/3013 |
| 2021/0096571 A1* | 4/2021 | Modalavalasa | G05D 1/0027 |
| 2021/0097148 A1* | 4/2021 | Bagschik | G06F 30/20 |
| 2021/0133218 A1* | 5/2021 | Bukowski | G06F 16/2365 |
| 2021/0287297 A1* | 9/2021 | Hayward | G08B 25/016 |

OTHER PUBLICATIONS

Tlig et al. (Autonomous Driving System : Model Based Safety Analysis, IEEE, 2018, pp. 1-4) (Year: 2018).*

PCT Search Report and Written Opinion dated Feb. 19, 2021 for PCT Application No. PCT/US20/62602, 10 pages.

PCT Search Report and Written Opinion dated Dec. 3, 2020 for PCT Application No. PCT/US2020/051271, 9 pages.

Office Action for U.S. Appl. No. 16/586,853, dated Nov. 8, 2021, Bagschik, "Error Modeling Framework", 18 Pages.

Office Action for U.S. Appl. No. 16/708,019, dated Jul. 7, 2022, Modalavalsa, "Perception Error Models", 22 pages.

International Preliminary Report on Patentability for corresponding PCT Application No. PCT/US20/51271, dated Apr. 7, 2022, 7 pages.

International Preliminary Report on Patentability for PCT Application No. PCT/US20/62602, dated Jun. 23, 2022, 7 pgs.

* cited by examiner

SAFETY ANALYSIS FRAMEWORK

BACKGROUND

An autonomous vehicle can use an autonomous vehicle controller to guide the autonomous vehicle through an environment. For example, the autonomous vehicle controller can use planning methods, apparatuses, and systems to determine a drive path and guide the autonomous vehicle through the environment that contains dynamic objects (e.g., vehicles, pedestrians, animals, and the like) and static objects (e.g., buildings, signage, stalled vehicles, and the like). However, in order to ensure safety of the occupants, it's important to validate the safety of the controller.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
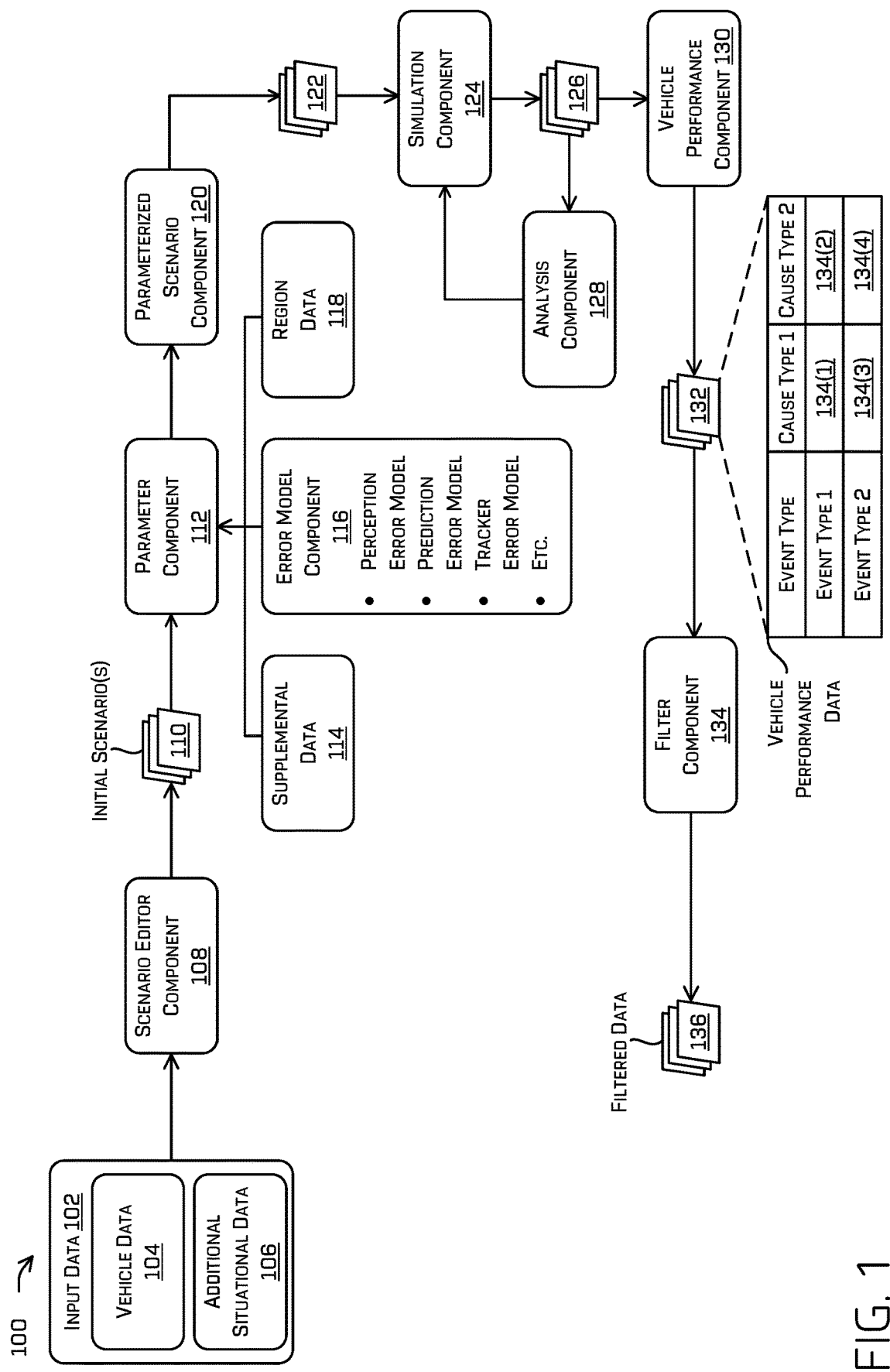
FIG. 1 illustrates generating vehicle performance data associated with a vehicle controller based on a parameterized scenario.

Techniques described herein are directed to various aspects of determining performance metrics of a system. In at least some examples described herein, such performance metrics may be determined, for example, using simulations in conjunction with other performance metric determinations. Simulations can be used to validate software (e.g., a vehicle controller) executed on vehicles (e.g., autonomous vehicles) and gather safety metrics to ensure that the software is able to safely control such vehicles in various scenarios. In additional or alternative examples, simulations can be used to learn about the constraints of autonomous vehicles that use the autonomous controller. For instance, simulations can be used to understand the operational space of an autonomous vehicle (e.g., an envelope in which the autonomous controller effectively controls the autonomous vehicle) in view of surface conditions, ambient noise, faulty components, etc. Simulations can also be useful for generating feedback for improving operations and designs of autonomous vehicles. For instance, in some examples, simulations can be useful for determining an amount of redundancy that is required in an autonomous controller, or how to modify a behavior of the autonomous controller based on what is learned through simulations. Furthermore, in additional or alternative examples, simulations can be useful to inform the hardware design of autonomous vehicles, such as optimizing placement of sensors on an autonomous vehicle.

When creating a simulation environment to perform testing and validation, it is possible to specifically enumerate the environment with various and specific examples. Each instantiation of such an environment can be unique and defined. Enumerating all possible scenarios manually can require inordinate amounts of time and, if not every possible scenario is constructed, various scenarios can go untested. A scenario parameter can be used to parameterize characteristics and/or attributes of an object within the scenario and provide variations of the scenario.

For example, a vehicle or multiple vehicles can traverse an environment and generate log data associated with the environment. The log data can include sensor data captured by one or more sensors of the vehicle, perception data indicating objects identified by one or more systems onboard the vehicle (or produced during a post-processing phase), prediction data indicating an intent of objects (whether produced during the recording or subsequent thereto), and/or status data indicating diagnostic information, trajectory information, and other information generated by the vehicle. The vehicle can transmit the log data, via a network, to a database that stores log data and/or to a computing device that analyzes the log data.

The computing device can, based on the log data, determine various scenarios, a frequency of the various scenarios, and regions of the environment that are associated with the various scenarios. In some instances, the computing device can group similar scenarios represented in the log data. For example, scenarios can be grouped together using, for example, k-means clustering and/or evaluating a weighted distance (e.g., Euclidian) between parameters of the environment (e.g., day time, night time, precipitation, vehicle position/velocity, object position/velocity, road segments, etc.). As discussed above, clustering similar or like scenarios can reduce the amount of computational resources required for simulating an autonomous controller in an environment by simulating the autonomous controller in unique scenarios rather than simulating the autonomous vehicle in nearly similar scenarios which results in redundant simulation data/results. As can be understood, an autonomous controller may be expected to perform (and/or may have demonstrably performed) similarly in like scenarios.

For example, the computing device can determine a rate at which pedestrians appear at a crosswalk based on a number of pedestrians represented in the log data. In some instances, the computing device can determine a probability of detecting a pedestrian at the crosswalk based on the rate and a time period of operating the autonomous vehicle. Based on the log data, the computing device can determine a scenario(s) and identify a scenario parameter(s) based on the scenario(s) that can be used in simulation.

In some instances, the simulation can be used to test and validate a response of the autonomous vehicle controller to a defective (and/or a faulty) sensor of the vehicle and/or a defective (and/or faulty) processing of sensor data. In such an example, the computing device can be configured to introduce inconsistencies in a scenario parameter of an object. For example, an error model can indicate an error and/or an error percentage associated with a scenario parameter. The scenario can incorporate the error and/or the error percentage into a simulated scenario and simulate the response of the autonomous vehicle controller. Such errors may be represented by, without limitation, look-up tables determined based on statistical aggregation using ground-truth data, functions (e.g., errors based on input parameters), or any other model which maps a parameter to a particular error. In at least some examples, such error models may map particular errors with probabilities/frequencies of occurrence.

By way of example and without limitation, the error model can indicate that a scenario parameter such as a speed associated with an object in a simulation environment is associated with an error percentage. For example, the object can be traveling in the simulated scenario at a speed of 10 meters per second and the error percentage can be 20% resulting in a range of speeds between 8 meters per second and 12 meters per second. It some instances, the range of speeds can be associated with a probability distribution indicating that portions of the range have a higher probability of occurring than other portions of the range (e.g., 8 meters per second and 12 meters per second associated with a 15% probability, 9 meters per second and 11 meters per second associated with a 30 percent probability, and 10 meters per second associated with a 10% probability).

Based on the error model and/or the scenario(s), a parameterized scenario can be generated. The parameterized scenario can provide a set of variations of a scenario. Therefore, instantiating the autonomous vehicle controller in the parameterized scenario and simulating the parameterized scenario can efficiently cover a wide range of variations of a scenario without requiring a manual enumeration of the variations. Additionally, based at least in part on executing the parameterized scenario, simulation data can indicate how the autonomous vehicle controller responded to (or will respond to) the parameterized scenario and determine a successful outcome or an unsuccessful outcome based at least in part on the simulation data.

Aggregating the simulation data related to the parameterized scenario can provide safety metrics associated with the parameterized scenario. For example, the simulation data can indicate a success rate and/or a failure rate of the autonomous vehicle controller and the parameterized scenario. In some instances, meeting or exceeding a success rate can indicate a successful validation of the autonomous vehicle controller which can subsequently be downloaded by (or otherwise transferred to) a vehicle for further vehicle control and operation.

For example, a parameterized scenario can be associated with an outcome. The simulation data can indicate that the autonomous vehicle controller responded consistently or inconsistently with the outcome. By way of example and without limitation, the parameterized scenario can represent a simulation environment including a vehicle controlled by an autonomous vehicle controller traveling at a speed and performing a stop action before an object that is in front of the vehicle. The speed can be associated with a scenario parameter indicating a range of speeds of the vehicle. The parameterized scenario can be simulated based at least in part on the range of speeds and can generate simulation data indicating a distance between the vehicle and the object when the vehicle completes the stop action. The parameterized scenario can be associated with an outcome indicating that the distance between the vehicle and the object meets or exceeds a distance threshold. Based on the simulation data and the scenario parameter, a success rate can indicate the number of times that the distance between the vehicle and the object when the vehicle completes the stop action meets or exceeds the distance threshold as compared to the total number of times that the vehicle completed the stop action.

Techniques described herein offer various computational efficiencies. For instance, by using the techniques described herein, computing devices require fewer computational resources and a plurality of simulated scenarios can be generated faster than what is available via conventional techniques. Conventional techniques are not scalable. For instance, generating a set of unique simulated environments—as many as are needed for training, testing, and/or validating systems (e.g., one or more components of an AI stack) onboard an autonomous vehicle (e.g., prior to such autonomous vehicle(s) being deployed in corresponding new real environments)—can take an inordinate amount of time, thereby limiting the ability to train, test, and/or validate such systems (e.g., one or more components of an AI stack) onboard an autonomous vehicle prior to entering into real scenarios and/or environments. Techniques described herein are unconventional in that they leverage sensor data collected from real environments and supplement that data with additional data to generate a substantially accurate simulated environment (e.g., relative to the corresponding real environment) more efficiently than what is available with conventional techniques. Further, techniques described herein—such as varying aspects of the scenario—enable the generation of many, scalable simulated scenarios in less time and with fewer computational resources than what is available with conventional techniques.

Furthermore, techniques described herein are directed to improvements in safety. That is, simulated environments resulting from generation techniques described herein can be used for testing, training, and validating systems onboard an autonomous vehicle to ensure such systems can operate autonomous vehicles safely when deployed in real environments. That is, simulated environments resulting from generation techniques described herein can be used for testing, training, and validating a planner system and/or a prediction system of an autonomous vehicle controller, which can be used by an autonomous vehicle to navigate the autonomous vehicle along a trajectory in a real environment. Thus, such training, testing, and validating enabled by techniques described herein can provide opportunities to ensure that autonomous vehicles can operate in real world environments safely. As such, techniques described herein improve safety and impact navigation.

FIG. 1 illustrates an example 100 of generating vehicle performance data associated with a vehicle controller based on a parameterized scenario. To generate a scenario, input data 102 can be used. The input data 102 can include vehicle data 104 and/or additional situational data 106. The vehicle data 104 can include log data captured by a vehicle traveling through an environment. As discussed above, the log data can be used to identify scenarios for simulating an autonomous controller. For the purpose of illustration, the vehicle can be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such an example, since the vehicle can be configured to control all functions from start to stop, including all parking functions, it can be unoccupied. This is merely an example, and the systems and methods described herein can be incorporated into any ground-borne, airborne, or waterborne vehicle, including those ranging from vehicles that need to be manually controlled by a driver at all times, to those that are partially or fully autonomously controlled.

The vehicle can include a computing device that includes a perception engine and/or a planner and perform operations such as detecting, identifying, segmenting, classifying, and/or tracking objects from sensor data collected from the environment. For example, objects such as pedestrians, bicycles/bicyclists, motorcycles/motorcyclists, buses, streetcars, trucks, animals, and/or the like can be present in the environment.

As the vehicle traverses through the environment, the sensors can capture sensor data associated with the environment. For example, some of the sensor data can be associated with objects (e.g., vehicles, cyclists, and/or pedestrians). In some instances, the sensor data can be associated with other objects including, but not limited to, buildings, road surfaces, signage, barriers, etc. Therefore, in some instances, the sensor data can be associated with dynamic objects and/or static objects. The dynamic objects can be, as described above, objects that are associated with a movement (e.g., vehicles, motorcycles, cyclists, pedestrians, animals, etc.) or capable of a movement (e.g., parked vehicles, standing pedestrians, etc.) within the environment. The static objects can be, as described above, objects that are associated with the environment such as, for example, buildings/structures, road surfaces, road markers, signage, barriers, trees, sidewalks, etc. In some instances, the vehicle computing device can determine information about objects in the environment, such as bounding boxes, classifications, segmentation information, and the like.

The vehicle computing device can use the sensor data to generate a trajectory for the vehicle. In some instances, the vehicle computing device can also determine pose data associated with a position of the vehicle. For example, the vehicle computing device can use the sensor data to determine position data, coordinate data, and/or orientation data of the vehicle in the environment. In some instances, the pose data can include x-y-z coordinates and/or can include pitch, roll, and yaw data associated with the vehicle.

The vehicle computing device can generate vehicle data 104 which can include the data discussed above. For example, the vehicle data 104 can include the sensor data, perception data, planning data, vehicle status data, velocity data, intent data, and/or other data generated by the vehicle computing device. In some instances, the sensor data can include data captured by sensors such as time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor data can be data captured by such sensors such as time-of-flight data, location data, lidar data, radar data, sonar data, image data, audio data, etc. Such log data may further include intermediate output by any one or more systems or subsystems of the vehicle including, but not limited to, messages indicating object detections, object tracks, predictions of future object locations, pluralities of trajectories generated in response to such detections, control signals passed to one or more systems or subsystems used to effectuate commands, and the like. In some instances, the vehicle data 104 can include time data that is associated with the other data generated by the vehicle computing device.

In some instances, input data 102 can be used to generate a scenario. The input data 102 can include vehicle data 104 and/or additional situational data 106. By way of example and without limitation, the additional situational data 106 can include data such as an incident report from a third-party source. A third-party source can include a law enforcement agency, a department of motor vehicle, and/or a safety administration that can publish and/or store reports of activities and/or incidents. For example, a report can include a type of activity (e.g., a traffic hazard such as debris on a roadway, local flooding, etc.), a location, and/or a description of the activity. By way of example and without limitation, the report can describe that a driver, while operating a vehicle, struck a fallen tree branch in a roadway while traveling at a speed of 15 meters per second. The report can be used to generate a similar scenario that can be used in simulation.

In some instances, the additional situational data 106 can include captured sensor data (e.g., image data). By way of example and without limitation, a driver of a vehicle can use a camera to capture image data while the driver operates the vehicle. In some instance, the image data can capture activity such as an incident. By way of example and without limitation, a driver can use a dashboard camera (e.g., a camera mounted on an interior dashboard of a vehicle) to capture image data while the driver operates the vehicle. As the driver operates the vehicle, an animal can run across the roadway and the driver can immediately brake to slow the vehicle. The dashboard camera can capture image data of the animal running across the roadway and the vehicle slowing down. The image data can be used to generate a scenario of an animal running across a roadway. As discussed above, a probability that is associated with a scenario can be determined to identify scenarios for simulation based on the probability meeting or exceeding a probability threshold. By way of example and without limitation, a probability threshold of 0.001% can be used where a likelihood of encountering a scenario is less than 0.001%, then scenarios with a higher probability can be prioritized for simulation and determining safety metrics associated with the scenarios with the higher probability.

The input data 102, e.g., the vehicle data 104 and/or the additional situational data 106, can be used by a scenario editor component 108 to generate an initial scenario(s) 110. For example, the input data 102 can be input into the scenario editor component 108 which can generate a synthetic environment that represents at least a portion of the input data 102 in the synthetic environment. Examples of generating scenarios such as initial scenario(s) 110 and data generated by a vehicle that can be included in the vehicle data 104 can be found, for example, in U.S. patent application Ser. No. 16/392,094 titled "Scenario Editor and Simulator" and filed Apr. 23, 2019 which is incorporated by reference in its entirety.

The scenario editor component 108 can be configured to scan the input data 102 to identify one or more scenarios represented in the input data 102. By way of example and without limitation, the scenario editor component 108 can determine that a portion of the input data 102 represents a pedestrian crossing a street without a right-of-way (e.g., without a crosswalk, at an intersection without a walk indication, and the like). The scenario editor component 108 can identify this as a scenario (e.g., a jaywalking parameter) and label (and/or categorize) the scenario as, for example, a jaywalking scenario. For example, the scenario editor component 108 can use rules that define actions to generate the initial scenario(s) 110. By way of example and without limitation, a rule can define that a pedestrian crossing a road in a region that is not associated with a crosswalk is a jaywalker. In some instances, the scenario editor component 108 can receive label data from a user of the scenario editor component 108 to associate portions of the input data 102 with labels to generate the initial scenario(s) 110.

In some instances, the scenario editor component 108 can scan other portions of the input data 102 and identify similar scenarios and label the similar scenarios with the same jaywalking label. In some instances, the scenario editor component 108 can identify scenarios that do not correspond to (or is excluded from) an existing label and generate a new label for these scenarios. In some instances, the scenario editor component 108 can generate a library of scenarios and store the library of scenarios in a database within the scenario editor component 108. By way of example and without limitation, the library of scenarios can include crosswalk scenarios, merging scenarios, lane change scenarios, and the like.

In at least some examples, such initial scenarios 110 may be manually specified. For example, one or more users may designate certain scenarios to be tested to ensure that the vehicle is capable of safely operating when performing such scenarios, despite having never (or rarely) previously encountered the scenario.

The parameter component 112 can determine scenario parameter(s) associated with the initial scenario(s) 110 identified by the scenario editor component 108. By way of example and without limitation, the parameter component 112 can analyze the jaywalking scenario and determine scenario parameters associated with the jaywalking scenario that include a position of the pedestrian, a pose of the pedestrian, a size of the pedestrian, a velocity of the pedestrian, a track of the pedestrian, a distance between a vehicle and the pedestrian, a velocity of the vehicle, a width of a road, and the like.

In some instances, the parameter component 112 can determine a range or a set of values associated with the scenario parameter. For example, the parameter component 112 can determine a classification associated with an object (e.g., the pedestrian) represented in the initial scenario(s) 110 and determine other objects of the same classification in the input data 102. Then the parameter component 112 can determine a range of values associated with the scenario parameter as represented by the initial scenario(s) 110. By way of example and without limitation, the scenario parameter can indicate that the pedestrian can have a velocity with a range of 0.5-1.5 meters per second.

In some instances, the parameter component 112 can determine a probability associated with the scenario parameter. By way of example and without limitation, the parameter component 112 can associate a probability distribution such as a Gaussian distribution (also referred to as a normal distribution) with the scenario parameter. In some instances, the parameter component 112 can determine the probability associated with the scenario parameter based on the input data 102. As discussed above, the parameter component 112 can determine a classification associated with the object represented in the input data 102 and determine other objects of the same classification in the input data 102 and/or other log data. Then the parameter component 112 can determine a probability distribution of the scenario parameter associated with the object as represented by the input data 102 and/or the other log data.

By way of example and without limitation, the parameter component 112 can determine that 30% of pedestrians walk at a velocity below 0.3 meters per second, 30% of pedestrians walk at a velocity above 1.2 meters per second, and that 40% of pedestrians walk at a velocity between 0.3 and 1.2 meters per second. The parameter component 112 can use the distribution as a probability that the pedestrian of the jaywalking scenario will walk at a particular velocity. By way of an additional example and without limitation, the parameter component 112 can determine that a jaywalking scenario probability of 1% which can indicate that a vehicle traversing an environment will encounter a jaywalker 5% of the time while traversing the environment. In some instances, during a simulation of an autonomous vehicle controller, the scenario probability can be used to include the scenario at a rate that is associated with the scenario probability.

In some instances, the parameter component 112 can receive supplemental data 114 that is incorporated into the distribution. By way of example and without limitation, the parameter component 112 can determine scenario parameters indicating that a pedestrian can have a distance with a range of 30-60 meters to a vehicle while the vehicle travels at a velocity of 15 meters per second or alternatively represented as a time-to-collision of 2-4 seconds. The supplemental data 114 (e.g., a regulation or guideline) can indicate that the vehicle must handle scenarios with a 1.5 second time-to-collision which can be a lower bound (also referred to as a parameter threshold). The parameter component 112 can incorporate the supplemental data 114 and determine a scenario parameter as having a 1.5-4 second time-to-collision (although any time ranges can be specified). In some instances, the parameter component 112 can use the probability distribution discussed above to determine (using interpolation and/or extrapolation techniques) a probability associated with the supplemental data 114.

The error model component 116 can determine an error model that can indicate an error associated with a scenario parameter. For example, a perception error model can produce a perception error associated with a perception parameter of a simulated object, a prediction error model can produce a prediction error associated with a prediction parameter of a simulated object, etc. In some instances, as a vehicle traverses an environment, a sensor can produce erroneous sensor data and/or a computing device of the vehicle can incorrectly process the sensor data which can result in perception errors. Testing and simulating perception errors can help indicate an operational margin of the vehicle as it relates to potential perception errors. For example, a scenario parameter, such as a perception parameter, can indicate a size of an object or a range of positions of the object in an environment. The error model component 116 can, using a perception error model, indicate a potential error associated with the size of the object which can result in perception data of the vehicle that indicates that the object is larger or smaller than the actual object in the environment.

The error model component 116 can determine, for example, the perception error model by comparing the input data 102 to ground truth data. In some instances, the ground truth data can be manually labeled and/or determined from other, validated, machine-learned components. For example, the input data 102 can include the sensor data and/or the perception data generated by the vehicle(s). The error model component 116 can compare the input data 102 with the ground truth data which can indicate the actual parameters of an object in the environment. By comparing the input data 102 with the ground truth data, the error model component 116 can determine a perception error. By way of example and without limitation, the input data 102 can indicate that a pedestrian is 1.8 meters tall while the ground truth data indicates that the pedestrian is 1.75 meters tall, and, accordingly, the perception error model can indicate a perception error of approximately 3% (e.g., [(1.8-1.75)/1.8]*100).

In some instances, the error model component 116 can determine a classification associated with the object represented in the input data 102 and determine other objects of the same classification in the input data 102. Then the error model component 116 can determine a probability distribution (also referred to as an error distribution) associated with a range of errors of the object and associate the probability distribution with the object within the initial scenario(s) 110. By way of example and without limitation, the error model component 116 can determine that objects with a pedestrian classification have a perception error of 4%-6% and that objects with a vehicle classification have a perception error of 3%-5%. In some instances, the error model component 116 can determine a probability distribution indicating that, for example, objects greater than a threshold size are more or less likely to have an error (in classification, for example).

In some instances, the parameter component 112 can use region data 118 to determine a set of regions of an environment that are compatible with the scenario and the scenario parameter. By way of example and without limitation, the scenario can indicate that a vehicle has a velocity of 15 meters per second, that a pedestrian has a velocity of 1.5 meters per second, and that a distance between the vehicle and the pedestrian is 30 meters. The parameter component 112 can determine regions based on the region data 118 of an environment that conform with the scenario. By way of example and without limitation, the parameter component 112 could exclude school zones because a velocity of the vehicle in the scenario would likely exceed a speed limit associated with a school zone and therefore the scenario would not be valid in a school zone. However, such a vehicle velocity (e.g., 15 m/s) may be reasonable on county roads that are adjacent to farm land, and therefore such a region may be considered within the set of regions.

In some instances, the parameter component 112 can store the region data 118 that includes segments of drivable regions of an environment. Techniques for identifying segments and similar segments of drivable surfaces and segment classifications and/or stereotypes can be found, for example, in U.S. patent application Ser. No. 16/370,696 titled "Extension of Autonomous Driving Functionality to New Regions" and filed Mar. 19, 2019, and in U.S. patent application Ser. No. 16/376,842 titled "Simulating Autonomous Driving Using Map Data and Driving Data" and filed Apr. 5, 2019, which are incorporated by reference herein in their entirety.

For example, region data 118 of an environment can be parsed into segments and similar segments can be identified. In some instances, a segment can include a junction segment, e.g., an intersection, a merge, or the like, or a connecting road segment, e.g., a length and/or a width of a road between junctions. By way example and without limitation, all two-lane road segments having a speed limit within a 10-mph range can be associated with the same stereotype. In some instances, data can be associated with each of the individual segments. For example, a junction segment can include a junction type, e.g., a merge, a "T," a round-about, or the like; a number of roads meeting at the junction; a relative position of those roads, e.g., an angle between the roads meeting at the junction; information about traffic control signals at the junction; and/or other features. Data associated with a connecting road segment can include a number of lanes, a width of those lanes, a direction of travel in each of the lanes, an identification of parking lanes, a speed limit on the road segment, and/or other features.

In some examples, segments of the drivable surface can be grouped according to a segment classification or segment stereotype. By way of example and without limitation, some or all junction segments that conform to some range of metrics or attributes can be grouped together (e.g., using k-means, evaluating a weighted distance (e.g., Euclidian) between segment parameters, or otherwise clustering such segments based on segment parameters).

Scenarios that include the same or similar stereotypes can be used to verify functionality of the autonomous vehicle controller. For example, an autonomous vehicle can be expected to perform (and/or may have demonstrably performed) the same in the same or similar stereotypes. In some examples, the use of stereotypes can reduce a number of comparisons to be made. For example, by identifying similar regions, a reduced number of simulation scenarios that can provide useful information. The techniques described herein can reduce computational complexity, memory requirements, and processing time by optimizing over specific scenarios which provide useful information for validation and testing.

A parameterized scenario component 120 can use the data determined by the parameter component 112 (e.g., initial scenario(s) 110, scenario parameter(s), the set of regions, and/or the error model data) to generate a parameterized scenario 122. For example, the initial scenario(s) 110 can indicate scenarios such as a lane change scenario, a right turn scenario, a left turn scenario, an emergency stop scenario, etc.). The scenario parameter(s) can indicate a speed associated with a vehicle controlled by the autonomous vehicle controller, a pose of the vehicle, a distance between the vehicle and an object, and the like. In some instances, the scenario parameter(s) can indicate objects, positions associated with the objects, velocities associated with the objects, and the like. Further, the error model (e.g., the perception error model, the prediction error model, etc.) can indicate an error associated with the scenario parameter(s) and provide a range of values and/or probabilities associated with the scenario parameter(s). By way of example and without limitation, a scenario parameter such as a speed of the vehicle can be associated with a range of speeds such as 8-12 meters per second). As discussed above, the range of speeds can be associated with a probability distribution that indicates a probability of a speed within the range of speeds of occurring.

The set of regions can indicate portions of an environment that can be used to place the objects in a simulated environment. For example, the initial scenario(s) 110 can indicate a scenario that includes a two-way, multi-lane driving surface associated with a speed limit of 35 miles per hour. Based on the initial scenario(s) 110, the set of regions can exclude regions that would not include a two-way, multi-lane driving surface associated with a speed limit of 35 miles per hour such as, for example, parking lots. A parameterized scenario 122 can be used to cover the variations provided by the scenario parameter(s), the error model, the region data 118, etc.

By way of example and without limitation, the scenario parameter(s) can include a vehicle traversing an environment with a velocity of 10, 11, or 12 meters per second (or any velocity) while approaching a junction. The set of regions can include an uncontrolled junction, a junction with a four-way stop, and a junction with a traffic light. Additionally, the perception error model can indicate a perception error of 1.34%, as may be provided by the perception metrics determined for the perception system being tested. Therefore, the parameterized scenario 122 can allow for a total of 9various scenarios by varying the scenario parameters and the regions (e.g., 3 velocities*3 regions=9 scenarios/permutations). Additionally, as the simulation component 124 simulates the parameterized scenario, the simulation component 124 can use the perception error model to introduce a perception error associated with the perception data determined by the vehicle. As can be understood, this is merely an example and the parameterized scenario 122 can include more or fewer permutations as well as different types of scenario parameters, regions, and/or perception errors.

The simulation component 124 can execute the parameterized scenario 122 as a set of simulation instructions and generate simulation data 126. For example, the simulation component 124 can instantiate a vehicle controller in the simulated scenario. In some instances, the simulation component 124 can execute multiple simulated scenarios simultaneously and/or in parallel. Additionally, the simulation component 124 can determine an outcome for the parameterized scenario 122. For example, the simulation component 124 can execute a variation of the parameterized scenario 122 for use in a simulation for testing and validation. The simulation component 124 can generate the simulation data 126 indicating how the autonomous vehicle controller performed (e.g., responded) and can compare the simulation data 126 to a predetermined outcome and/or determine if any predetermined rules/assertions were broken/triggered.

In some instances, the variation for simulation can be selected based on generalized spacing of a scenario parameter. By way of example and without limitation, a scenario parameter can be associated with a speed of a vehicle. Additionally, the scenario parameter can be associated with a range of values of the vehicle. Variations for simulation can be selected based on generalized spacing to increase a coverage of the range of values (e.g., selecting the $25^{th}$ percentile, $50^{th}$ percentile, 75% percentile, etc.). In some instances, variations can be randomly selected and/or variations can be randomly selected within standard deviations of the range of values.

In some instances, the predetermined rules/assertions can be based on the parameterized scenario 122 (e.g., traffic rules regarding crosswalks can be enabled based on a crosswalk scenario or traffic rules regarding crossing a lane marker can be disabled for a stalled vehicle scenario). In some instances, the simulation component 124 can enable and disable rules/assertions dynamically as the simulation progresses. For example, as a simulated object approaches a school zone, rules/assertions related to school zones can be enabled and disabled as the simulated object departs from the school zone. In some instances, the rules/assertions can include comfort metrics that relate to, for example, how quickly an object can accelerate given the simulated scenario. In at least some examples, the rules may include, for example, following rules of the road, leaving a safety buffer between objects, etc.

Based at least in part on determining that the autonomous vehicle controller performed consistent with the predetermined outcome (that is, the autonomous vehicle controller did everything it was supposed to do) and/or determining that a rule was not broken or an assertion was not triggered, the simulation component 124 can determine that the autonomous vehicle controller succeeded. Based at least in part on determining that the autonomous vehicle controller performance was inconsistent with the predetermined outcome (that is, the autonomous vehicle controller did something that it wasn't supposed to do) and/or determining that a rule was broken or than an assertion was triggered, the simulation component 124 can determine that the autonomous vehicle controller failed. Accordingly, based at least in part on executing the parameterized scenario 122, simulation data 126 can indicate how the autonomous vehicle controller responds to each variation of the parameterized scenario 122, as described above and determine a successful outcome or an unsuccessful outcome based at least in part on the simulation data 126.

An analysis component 128 can be configured to determine degrees of a success or a failure. By way of example and without limitation, a rule can indicate that a vehicle controlled by an autonomous vehicle controller must stop within a threshold distance of an object. The simulation data 126 can indicate that in a first variation of the parameterized scenario 122, the simulated vehicle stopped in excess of 5 meters from the threshold distance. In a second variation of the parameterized scenario 122, the simulation data 126 can indicate that the simulated vehicle stopped in excess of 10 meters from the threshold distance. The analysis component 128 can indicate that the simulated vehicle performed more successfully in the second variation compared to the simulated vehicle in the first variation. For example, the analysis component 128 can determine an ordered list (e.g., ordered according to a relative success scale) that includes simulated vehicles and the associated variations of the parameterized scenario 122. Such variations may also be used to determine limitations of the various components of the system being simulated.

The analysis component 128 can, based on the simulation data 126, determine additional variations of the parameterized scenario 122. For example, the simulation data 126 output by the simulation component 124 can indicate variations of the parameterized scenario 122 associated with a success or a failure (which may be represented as a continuous likelihood). The analysis component 128 can determine additional variations based on the variations associated with a failure. By way of example and without limitation, a variation of the parameterized scenario 122 associated with a failure can represent a vehicle traveling on a driving surface at a speed of 15 meters per second and an animal crossing the driving surface at a distance of 20 meters in front of the vehicle. The analysis component 128 can determine additional variations of the scenario to determine additional simulation data 126 for analysis. By way of example and without limitation, the analysis component 128 can determine additional variations that include the vehicle traveling at 10 meters per second, 12.5 meters per second, 17.5 meters per second, 20 meters per second, etc. Additionally, the analysis component 128 can determine additional variations that include the animal crossing the driving surface at a distance of 15 meters, 17.5 meters, 22.5 meters, and 25 meters, etc. The additional variations can be input into the simulation component 124 to generate additional simulation data. Such additional variations may be determined based on, for example, perturbations to the scenario parameters for the scenario being run in simulation.

In some instances, the analysis component 128 can determine additional variations of the scenario by disabling a scenario parameter. For example, a parameterized scenario can include a first scenario parameter that is associated with a speed of an object and a second scenario parameter that is associated with a position of the object. The parameterized scenario 122 can include a first range of values associated with the speed and a second range of values associated with the position. In some instances, after simulating the parameterized scenario 122, the simulation data 126 can indicate that some variations of the parameterized scenario 122 resulted in a successful outcome and some variations resulted in a failed outcome. Then, the analysis component 128 can determine to disable the first scenario parameter (e.g., set a fixed value associated with the first scenario parameter) and vary the parameterized scenario 122 based on the second scenario parameter. By disabling one of the scenario parameters, the analysis component 128 can determine whether a scenario parameter and/or a value of a scenario parameter is associated with the successful outcomes or the failed outcomes. Such parameters may be disabled based on likelihoods of failure, randomly, or otherwise. By way of example and without limitation, simulation data 126 as a result of disabling all of the scenario parameters can indicate a problem with a planning component of an autonomous vehicle.

In some instances, the analysis component 128 can be used to perform sensitivity analysis. For example, the analysis component 128 can disable a scenario parameter and, based on the simulation data 126 generated by the simulation component 124, determine how disabling the scenario parameter affects the simulation data 126 (e.g., increase a success rate, decrease a success rate, have minimal impact on the success rate). In some instances, the analysis component 128 can disable scenario parameters individually to determine how disabling each scenario parameter affects the simulation data 126. The analysis component 128 can collect statistical data that indicates how individual scenario parameters affect the simulation data 126 over the course of many simulations. In some instances, the analysis component 128 can be configured to disable a set of scenario parameters (e.g., disabling a night time environmental parameter and disabling a wet conditions environmental parameter). As discussed above, the analysis component can collect statistical data that indicates how sets of scenario parameters affect the simulation data 126. The statistical data can be used to determine scenario parameters that increase or decrease a likelihood of resulting is a successful simulation and can be used to identify subsystems of an autonomous vehicle that are associated with a scenario parameter as increasing or decreasing a success rate of the simulation data 126.

In some instances, the analysis component 128 can adjust a degree by which a scenario parameter is adjusted. By way of example and without limitation, a scenario parameter can indicate wet environment conditions (e.g., rainy conditions). The scenario parameter can be adjusted on a range (e.g., a quarter inch of rainfall, an inch of rainfall, etc.). The analysis component 128 can adjust a magnitude of the scenario parameter and perform the sensitivity analysis based on the magnitude of the scenario parameter to determine a threshold associated with the scenario parameter that can result in a successful or an unsuccessful outcome of the simulation. In some instances, a binary search algorithm, a particle filter algorithm, and/or a Monte Carlo method can be used to determine the threshold, although other suitable algorithms are contemplated.

The vehicle performance component 130 can, based on the simulation data 126 (and/or the additional simulation data based on the additional variations from the analysis component 128) and the types of failures, determine the vehicle performance data 132. In some instances, the vehicle performance data 132 can indicate how a vehicle performs in an environment. By way of example and without limitation, the vehicle performance data 132 can indicate that a vehicle traveling at a speed of 15 meters per second has a stopping distance of 15 meters. In some instances, the vehicle performance data can indicate safety metrics. By way of example and without limitation, the vehicle performance data 132 can indicate an event (e.g., a failure) and a cause of the event. In at least some examples, such indication may be binary (failure or not), coarse (levels of failure, e.g., "critical", "non-critical", and "pass"), or continuous (e.g., representing a probability of failure), though any other indication is contemplated. For example, for an event type 1 and a cause type 1, the data 134(1) can indicate a safety rating and similarly for data 134(2)-134(4). In some instances, the cause type 1 and the cause type 2 can indicate a fault such as a fault of the vehicle or a fault of an object (e.g., a bicyclist). The vehicle performance data 132 can then indicate a safety metric associated with the parameterized scenario 122. In some instances, the vehicle performance component 130 can use a target metric and compare the vehicle performance data 132 with the target metric to determine if the safety metric meets or exceeds the target metric. In some instances, the target metric can be based on standards and/or regulations associated with autonomous vehicles.

In some instances, the vehicle performance data 132 can be input into a filter component 134 to determine filtered data 136 based on the vehicle performance data 132. For example, the filter component 134 can be used to determine filtered data 136 that identifies regions that do not meet a coverage threshold. By way of example and without limitation, the initial scenario(s) 110 can indicate a two-way, multi-lane driving surface associated with a speed limit of 35 miles per hour and the region data 118. Based on the initial scenario(s) 110 and the region data 118, the parameter component 112 can identify five regions of an environment that can be used to simulate the initial scenario(s) 110. After simulating the parameterized scenario 122, the vehicle performance data 132 can indicate that the simulation data 126 is associated with three of the five regions. For example, the simulation component 124 can simulate the scenarios and generate simulation data 126 based on executing the scenario in three of the five regions identified by the parameter component 112. The filter component 134 can, based on one or more filters, determine filtered data 136 that indicates that the remaining 2 of the 5 regions do not meet a coverage threshold (e.g., a minimum number of simulations associated with a region).

In some instances, the filter component 134 can determine, based on the vehicle performance data 132, filtered data 136 that indicates occurrences of an event. By way of example and without limitation, the simulation data 126 can include occurrences of events such as an emergency stop, a flat tire, an animal crossing a driving surface, and the like. The filter component 134 can, based on one or more filters, determine filtered data 136 that indicates occurrences of the emergency stop. Additionally, the filtered data 136 can include portions of the simulation data 126 associated with the occurrences of the emergency stop such as, for example, a stopping distance associated with the emergency stop.

Figure 2:
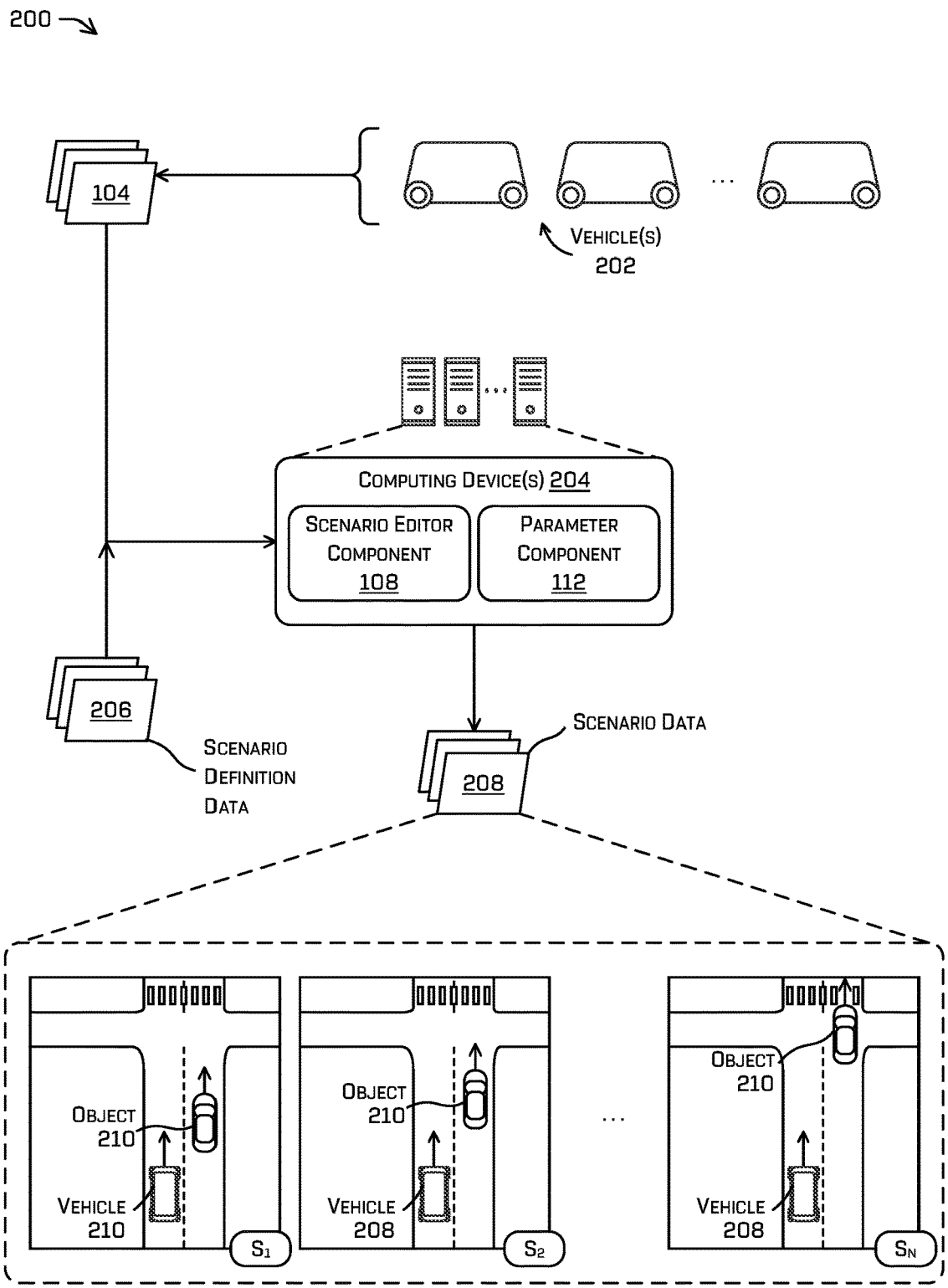
FIG. 2 illustrates the computing device(s) generating scenario data based at least in part on the log data generated by the vehicle(s), where the scenario data depicts one or more variations of a scenario.

FIG. 2 illustrates an example 200 of vehicle(s) 202, which can be similar to the vehicle generating vehicle data 104 described with reference to FIG. 1, generating the vehicle data 104 and transmitting the vehicle data 104 to the computing device(s) 204. As discussed above, the scenario editor component 108 can be configured to scan the input data 102 (e.g., the vehicle data 104 and/or the additional situational data 106) and identify one or more scenarios represented in the input data 102. As a non-limiting example, such scenarios may be determined based on, for example, clustering (e.g., using k-means or the like) parameterizations of the log data. In some instances, the scenario editor component 108 can use scenario definition data 206 to identify the one or more scenarios represented in the input data 102. For example, the scenario definition data 206 can identify features associated with a type of scenario. By way of example and without limitation, the scenario definition data 206 can identify a jaywalking scenario that includes features such as a pedestrian crossing a portion of a driving surface that is not associated with a crosswalk. The scenario editor component 108 can scan the input data 102 to identify portions of the input data that include the features of a pedestrian crossing a portion of a driving surface that is not associated with a crosswalk to determine jaywalking scenarios. In at least some examples, such scenarios may further be manually entered and/or derived from third-party data (e.g., police reports, video clips generally available, and the like).

Additionally, as discussed above, the parameter component 112 can determine scenario parameter(s) that can indicate a value or a range of values associated with a parameter of an object in the scenario. The parameter component 112 can generate scenario data 208 as depicted in FIG. 2.

The scenario data 208 can indicate a base scenario that includes a vehicle 210 traversing along a driving surface and an object 212 (which can be a different vehicle) traversing near the vehicle 210 in a same direction as the vehicle 210. The vehicle 210 and the object 212 can be approaching a junction with a crosswalk. The parameter component 112 can determine a scenario parameter that indicates a distance between the vehicle 210 and the object 212 as having a range of distances. Therefore, the scenario $S_1$ can represent a first scenario of a set of scenarios having a first distance between the vehicle 210 and the object 212, the scenario $S_2$ can represent a second scenario of the set of scenarios having a second distance between the vehicle 210 and the object 212, and the scenario SN can represent an Nth scenario of the set of scenarios having an Nth distance between the vehicle 210 and the object 212. Examples of additional types of parameters (also referred to as attributes) can be found, for example, in U.S. patent application Ser. No. 16/363,541 titled "Pedestrian Prediction Based on Attributes" and filed Mar. 25, 2019, which is hereby incorporated by reference in its entirety.

For example, scenario parameters can include, but are not limited to, a velocity of the object 212, an acceleration of the object 212, an x-position of the object 212 (e.g., a global position, local position, and/or a position with respect to any other frame of reference), a y-position of the object 212 (e.g., a size, a pose, a local position, a global position and/or a position with respect to any other frame of reference), a bounding box associated with the object 212 (e.g., extents (length, width, and/or height), yaw, pitch, roll, etc.), lighting states (e.g., brake light(s), blinker light(s), hazard light(s), headlight(s), reverse light(s), etc.), a wheel orientation of the object 212, map elements (e.g., a distance between the object 212 and a stop light, stop sign, speed bump, intersection, yield sign, and the like), a classification of the object 212 (e.g., vehicle, car, truck, bicycle, motorcycle, pedestrian, animal, etc.), an object characteristic (e.g., whether the object is changing lanes, whether the object 212 is a double-parked vehicle, etc.), proximity with one or more objects (in any coordinate frame), lane types (e.g., direction of a lane, parking lane), road markings (e.g., indicative of whether passing or lane changes are permitted, etc.), an object density, and the like.

As discussed above, the parameter component 112 can determine a range of values associated with the scenario parameter as represented by the vehicle data 104 and/or the other input data. Therefore, each of the example scenario parameters identified above as well as other scenario parameters can be associated with a set or a range of values that can be used to generate a set of scenarios where the scenarios of the set of scenarios differ by one or more values of the scenario parameters.

Figure 3:
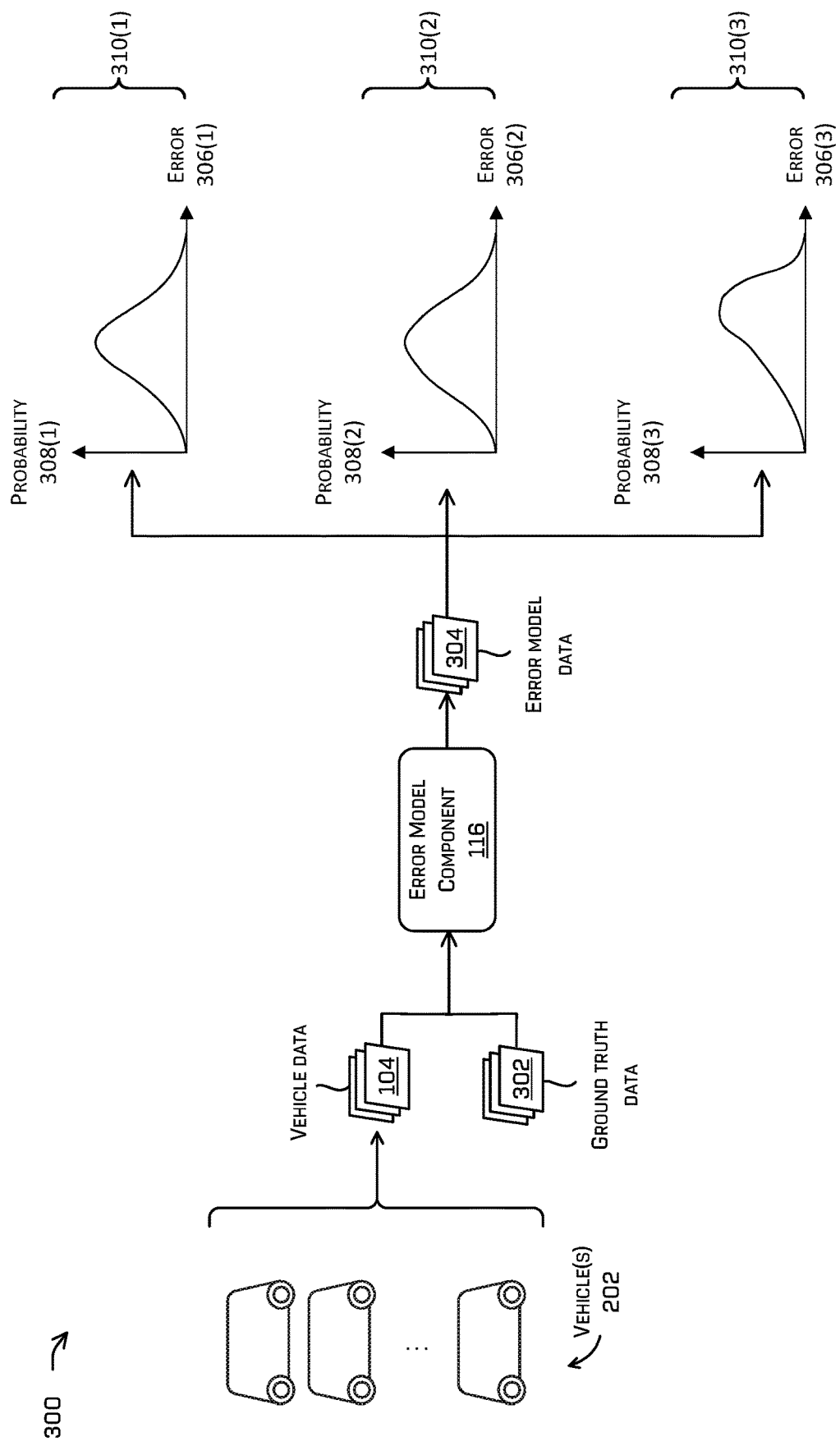
FIG. 3 illustrates generating error model data based at least in part on vehicle data and ground truth data.

FIG. 3 illustrates an example 300 of generating error model data based at least in part on vehicle data and ground truth data. As depicted in FIG. 3, vehicle(s) 202 can generate vehicle data 104 and transmit the vehicle data 104 to an error model component 116. As discussed above, the error model component 116 can determine an error model that can indicate an error associated with a scenario parameter. For example, the vehicle data 104 can be data associated with a subsystem of the vehicle(s) 202 such as a perception system, a planning system, a tracking system (also referred to as a tracker system), a prediction system, and the like. By way of example and without limitation, the vehicle data 104 can be associated with a perception system and the vehicle data 104 can include a bounding box associated with an object detected by the vehicle(s) 202 in an environment.

The error model component 116 can receive ground truth data 302 which can be manually labeled and/or determined from other, validated, machine-learned components. By way of example and without limitation, the ground truth data 302 can include a validated bounding box that is associated with the object in the environment. By comparing the bounding box of the vehicle data 104 with the bounding box of the ground truth data 302, the error model component 116 can determine an error associated with the subsystem of the vehicle(s) 202. In some instances, the vehicle data 104 can include one or more characteristics (also referred to as parameters) associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc. Therefore, the error can be associated with the other characteristics (e.g., environmental parameters).

The error model component 116 can process a plurality of vehicle data 104 and a plurality of ground truth data 302 to determine the error model data 304. The error model data 304 can include the error calculated by the error model component 116 which can be represented as error 306(1)-(3). Additionally, the error model component 116 can determine a probability associated with the error 306(1)-(3) represented as probability 308(1)-(3) which can be associated with an environmental parameter to present error models 310(1)-(3). By way of example and without limitation, the vehicle data 104 can include a bounding box associated with an object at a distance of 50 meters from the vehicle(s) 202 in an environment that includes rainfall. The ground truth data 302 can provide the validated bounding box associated with the object. The error model component 116 can determine error model data 304 that determines that the error associated with the perception system of the vehicle(s) 202. The distance of 50 meters and the rainfall can be used as environmental parameters to determine which of error model of error models 310(1)-(3) to use. Once the error model is identified, the error model 310(1)-(3) can provide an error 306(1)-(3) based on the probability 308(1)-(3) where errors 306(1)-(3) associated with higher probabilities 308(1)-(3) are more likely to be selected than errors 306(1)-(3) associated with lower probabilities 308(1)-(3).

Figure 4:
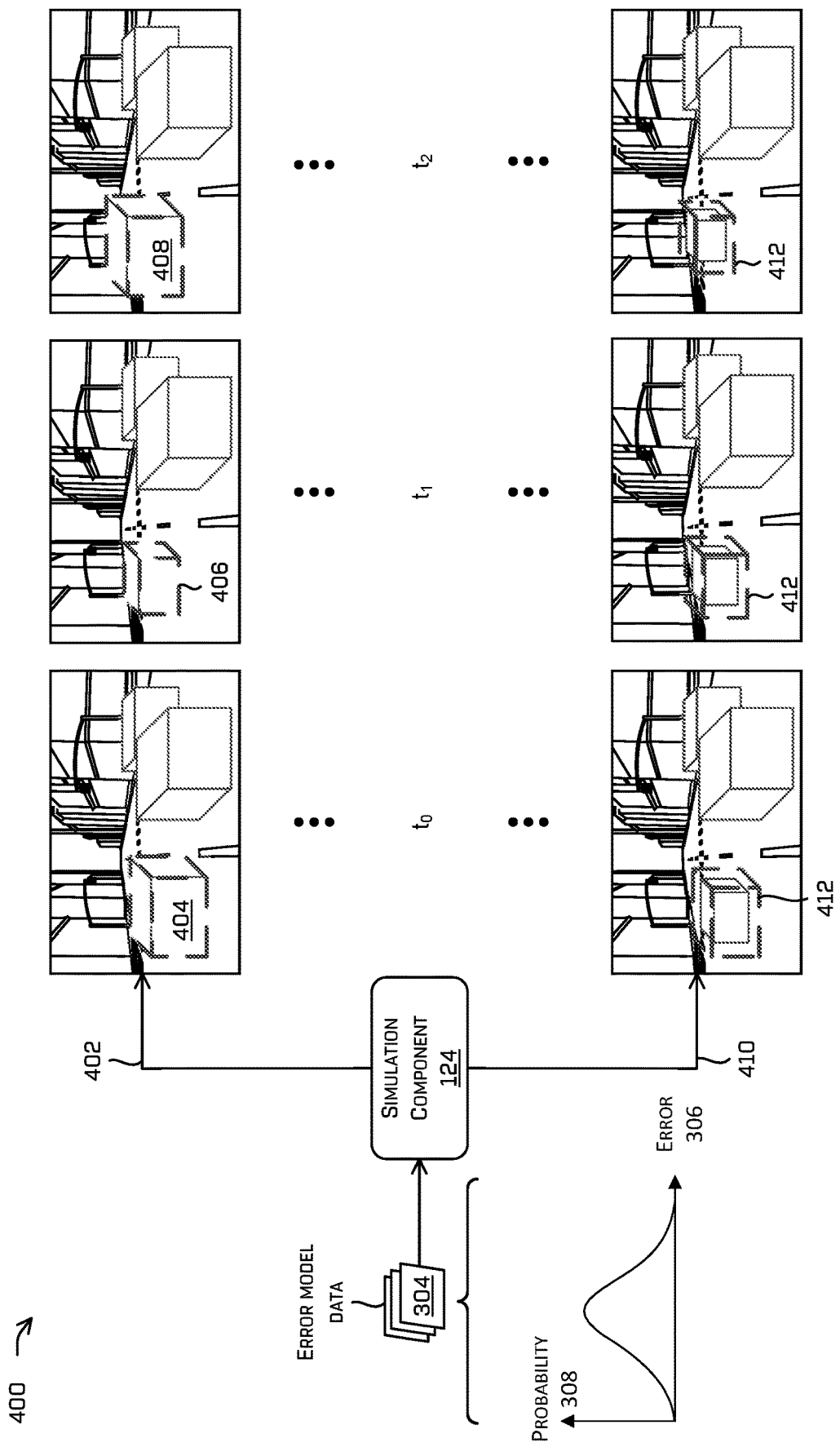
FIG. 4 illustrates using error model data to perturb a simulation by providing at least one of an error or an uncertainty associated with a simulated environment.

FIG. 4 illustrates an example 400 of using error model data to perturb a simulation by providing at least one of an error or an uncertainty associated with a simulated environment. As discussed above, the error model data can include an error model that associates an error 306 with a probability 308 and the error model can be associated with environmental parameters. A simulation component 124 can use the error model data 304 to inject an error which can result in a perturbed parameterized scenario to perturb the simulation. Based on the injected error, simulation data can indicate how an autonomous controller responds to the injected error.

For example, the simulation component 124 can perturb the simulation by continuously injecting the error into the simulation. By way of example and without limitation, example 402 depicts a bounding box 404 associated with an object at a time to. The bounding box 404 can represent a detection of the object by a vehicle that includes an error such as an error in a size of the bounding box and/or a position of the bounding box. At a time $t_1$, the simulation component 124 can use the bounding box 406 that represents the object and that includes a different error. For example, at each simulation time (e.g., $t_0$, $t_1$, or $t_2$), the simulation component 124 can use a different error 306 based on the probability 308 associated with the error 306. At a time $t_2$, the simulation component 124 can use the bounding box 408 that represents the object and that includes a different error.

In some instances, the simulation component 124 can perturb the simulation by injecting an uncertainty associated with a bounding box that represents an object in the environment. By way of example and without limitation, example 410 depicts a bounding box 412 associated with an object at a time to. The bounding box can include an uncertainty of 5% which can indicate an uncertainty of the object's size and/or position by an amount of 5%. Additionally, the uncertainly can persist with the object through time $t_1$ and $t_2$ rather than injecting a different error at different simulation times as depicted in example 402.

Figure 5:
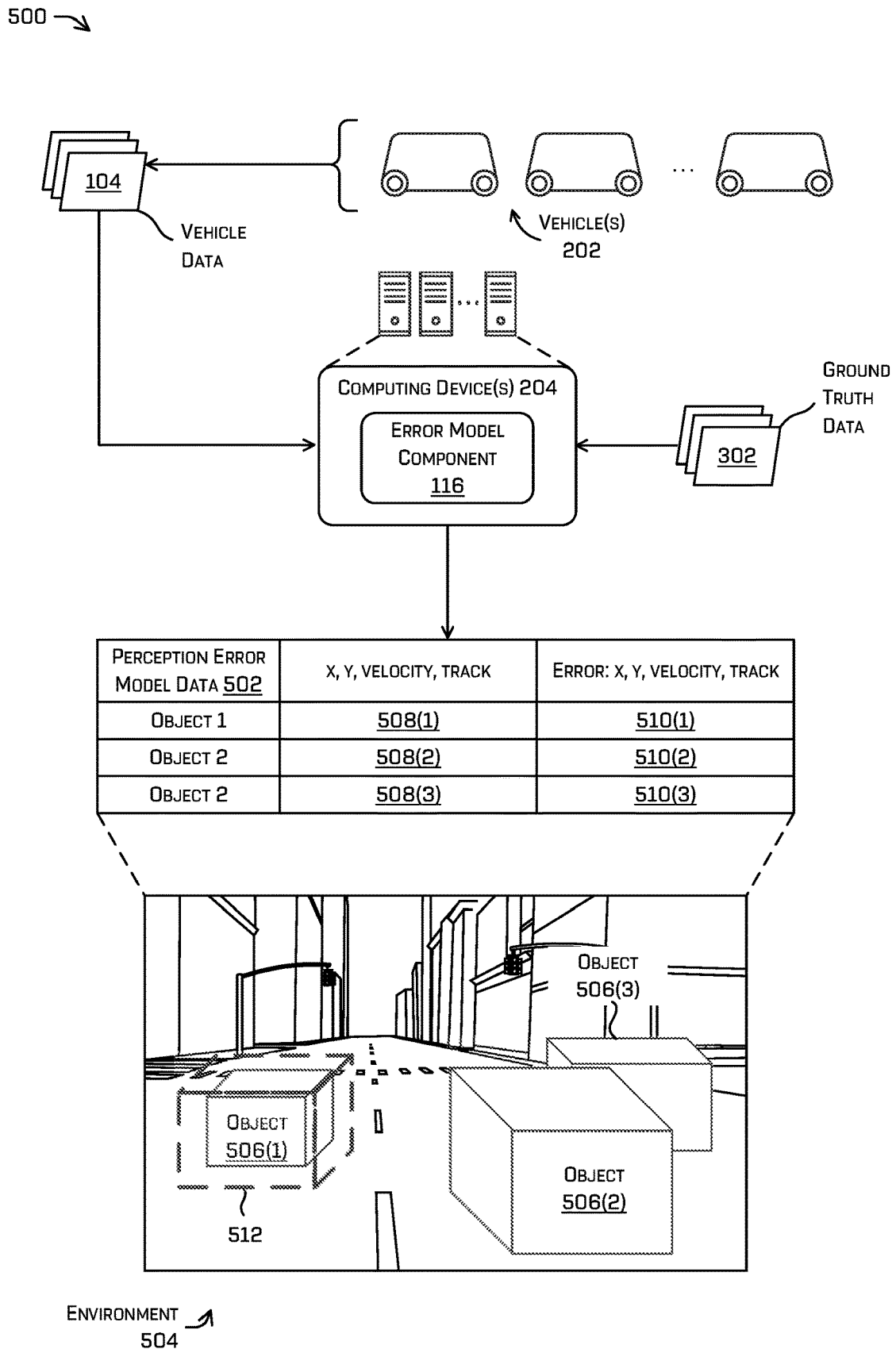
FIG. 5 illustrates the computing device(s) generating perception error model data based at least in part on log data generated by the vehicle(s) and ground truth data.

FIG. 5 illustrates an example 500 of vehicle(s) 202 generating vehicle data 104 and transmitting the vehicle data 104 to the computing device(s) 204. As discussed above, the error model component 116 can determine a perception error model that can indicate an error associated with a scenario parameter. As discussed above, the vehicle data 104 can include sensor data generated by a sensor of the vehicle(s) 202 and/or perception data generated by a perception system of the vehicle(s) 202. The perception error model can be determined by comparing the vehicle data 104 against ground truth data 302. The ground truth data 302 can be manually labeled and can be associated with the environment and can represent a known result. Therefore, a deviation from the ground truth data 302 in the vehicle data 104 can be identified as an error in a sensor system and/or the perception system of the vehicle(s) 202. By way of example and without limitation, a perception system can identify an object as a bicyclist where the ground truth data 302 indicates that the object is a pedestrian. By way of another example and without limitation, a sensor system can generate sensor data that represents an object as having a width of 2 meters where the ground truth data 302 indicates that the object has a width of 1.75 meters.

As discussed above, the error model component 116 can determine a classification associated with the object represented in the vehicle data 104 and determine other objects of the same classification in the vehicle data 104 and/or other log data. Then the error model component 116 can determine a probability distribution associated with a range of errors of associated with the object. Based on the comparison and the range of errors, the error model component 116 can determine the perception error model data 502.

As depicted in FIG. 5, an environment 504 can include objects 506(1)-(3) represented as bounding boxes generated by a perception system. The perception error model data 502 can indicate scenario parameters as 508(1)-(3) and the error associated with the scenario parameters as 510(1)-(3). As illustrated in FIG. 5, the error associated with object 508(1) can be visualized in environment 504 as a larger bounding box 512 that indicates an uncertainty regarding the dimensions of object 508(1).

Figure 6:
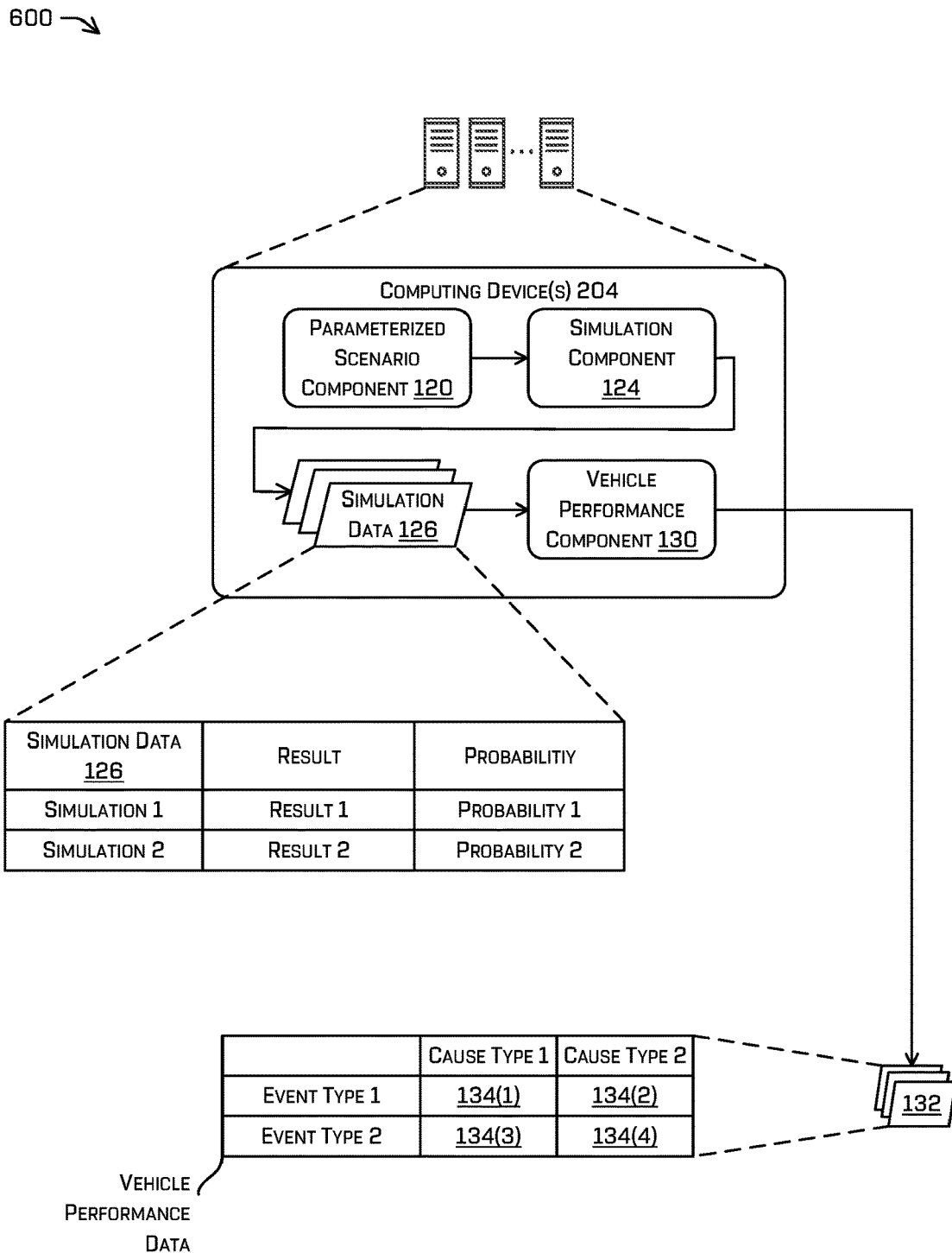
FIG. 6 illustrates the computing device(s) generating simulation data based at least in part on parameterized scenario data and generating safety metric data based at least in part on the simulation data.

FIG. 6 illustrates an example 600 of the computing device(s) 204 generating simulation data 126 and determining vehicle performance data 132. The parameterized scenario component 120 can, based on the scenario parameter(s), the set of regions, and the perception error model, determine a parameterized scenario. For example, the scenario parameter(s) can indicate the objects, positions associated with the objects, velocities associated with the objects, and the like in the parameterized scenario. Additionally, the scenario parameter(s) can indicate ranges that indicate a range of values and/or probabilities associated with the scenario parameter(s). The set of regions can indicate portions of an environment that can be used to place the objects in a simulated environment. Further, the perception error model can indicate an error associated with the scenario parameter(s). These can be combined, as detailed herein, to create a parameterized scenario that can cover the variations provided by the scenario parameter(s), the set of regions, and/or the perception error model.

The parameterized scenario can be used by the simulation component 124 to simulate the variations of the parameterized scenario. For example, the simulation component 124 can execute a variation of the parameterized scenario for use in a simulation for testing and validation. The simulation component 124 can generate the simulation data 126 indicating how the autonomous vehicle controller performed (e.g., responded) and can compare the simulation data 126 to a predetermined outcome and/or determine if any predetermined rules/assertions were broken/triggered.

As illustrated in FIG. 6, the simulation data 126 can indicate a number of simulations (e.g., simulation 1, simulation 2, etc.) and the result of the simulations (e.g., result 1, result 2). For example, as described above, the result can indicate a pass or a fail based on rules/assertions that were broken/triggered. Additionally, the simulation data 126 can indicate a probability of encountering the scenario. By way of example and without limitation, the simulation component 124 can simulate a scenario that includes a jaywalking pedestrian. The input data can indicate that a vehicle encounters a jaywalking pedestrian at a rate of 1 minute per 1 hour of driving. This can be used to determine a probability of encountering a particular simulation that is associated with a variation of the parameterized scenario. In some instances, the simulation component 124 can identify variations of the parameterized scenario that have a low probability and execute simulations that correspond to those variations. This can allow testing and verification of the autonomous vehicle controller in more unique circumstances.

Additionally, the simulation component 124 can identify variations of the parameterized scenario for additional simulation based on the result. By way of example and without limitation, the result of a simulation can be a failure where a scenario parameter was associated with a vehicle velocity of 15 meters per second. The simulation component 124 can identify velocities that are near the 15 meters per second velocity to determine a threshold at which the simulation will pass which can further assist the development of safer vehicle controllers.

Based on the simulation data 126, the vehicle performance component 130 can generate the vehicle performance data 132. As discussed above, for example, for an event type 1 and a cause type 1, the data 134(1) can indicate a safety rating and similarly for data 134(2)-134(4). In some instances, the event type can indicate a that a cost has met or exceed a cost threshold although other event types are contemplated. For example, a cost can include but is not limited to a reference cost, an obstacle cost, a lateral cost, a longitudinal cost, and/or the like.

A reference cost can comprise a cost associated with a difference between a point (also referred to as a reference point) on the reference trajectory and a corresponding point (also referred to as a point or a target point) on the target trajectory, whereby the difference represents one or more difference in a yaw, lateral offset, velocity, acceleration, curvature, curvature rate, and/or the like. In some examples, decreasing a weight associated with a reference cost can reduce a penalty associated with the target trajectory being located a distance away from the reference trajectory, which can provide smoother transitions leading towards safer and/or more comfortable vehicle operations.

In some examples, an obstacle cost can comprise a cost associated with a distance between a point on the reference trajectory or the target trajectory and a point associated with an obstacle in the environment. By way of example, the point associated with the obstacle can correspond to a point on a boundary of a drivable area or can correspond to a point associated with the obstacle in the environment. In some examples, an obstacle in the environment can include, but is not limited to a static object (e.g., building, curb, sidewalk, lane marking, sign post, traffic light, tree, etc.) or a dynamic object (e.g., a vehicle, bicyclist, pedestrian, animal, etc.). In some examples, a dynamic object can also be referred to as an agent. In some examples, a static object or a dynamic object can be referred to generally as an object or an obstacle.

In some examples, a lateral cost can refer to a cost associated with steering inputs to the vehicle, such as maximum steering inputs relative to a velocity of the vehicle. In some examples, a longitudinal cost can refer to a cost associated with a velocity and/or acceleration of the vehicle (e.g., maximum braking and/or acceleration). Such costs can be used to ensure that the vehicle is operating within feasible limits and/or comfort limits for passengers being ferried.

In some instances, the cause type 1 and the cause type 2 can indicate a fault such as a fault of the vehicle or a fault of an object (e.g., a bicyclist). The vehicle performance component 130 can use predetermined rules/assertions to determine the fault. By way of example and without limitation, a rule can indicate that when the vehicle is impacted by an object in the rear of the vehicle, while a fault can be associated with the object. In some instances, additional rules can be used such as indicating that the vehicle must be traversing the environment in a forward direction when impacted by an object in the rear. In some instances, a cause type (e.g., cause type 1 and/or cause type 2) can be associated with a component of the autonomous vehicle controller. As non-limiting examples, such causes may comprise a failure of a perception system, a prediction system, a planner system, a network latency, a torque/acceleration fault, and/or any other component or subcomponent of the vehicle.

As discussed above, an analysis component can determine, based on the simulation data 126, to disable a scenario parameter (e.g., set a fixed value associated with the scenario parameter) and vary other scenario parameters. By isolating a scenario parameter, the analysis component can determine scenario parameters that are associated with a successful or a failed outcome. The vehicle performance data 132 can then indicate a safety metric associated with the parameterized scenario. Additionally, the analysis component can perform sensitivity analysis to determine cause of a failure. For example, the analysis component can disable scenario parameters individually to isolate one or more scenario parameters and determine how disabling the scenario parameters affects a response of an autonomous vehicle, capture statistical data associated with disabling the one or more scenario parameters, and capture the results as successful or failed outcomes. The statistical data can that indicate how sets of scenario parameters affect the outcomes and can be used to determine scenario parameters that increase or decrease a likelihood of resulting is a successful simulation and can be used to identify subsystems of an autonomous vehicle that are associated with a scenario parameter as increasing or decreasing a success rate of the simulation data.

Figure 7:
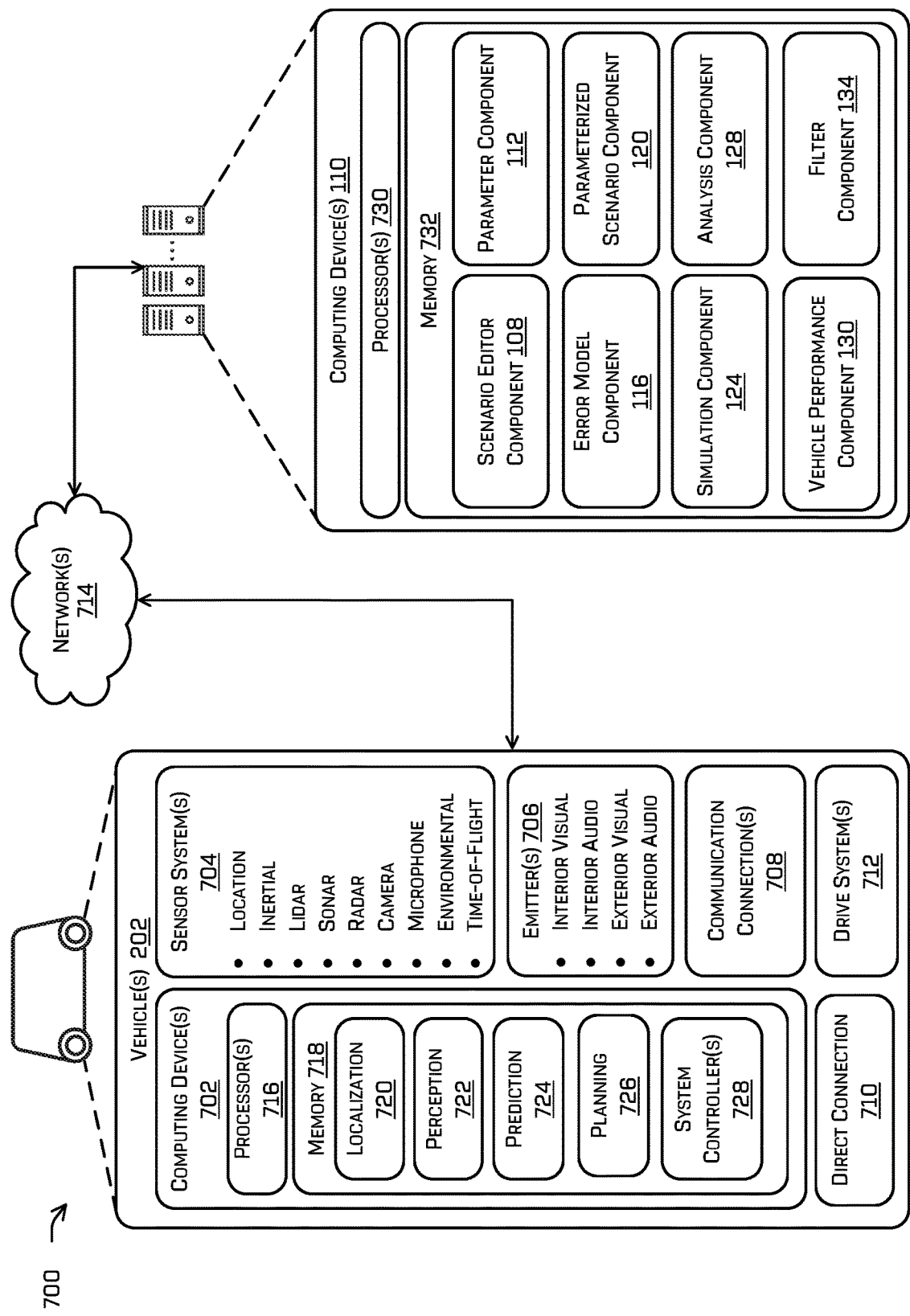
FIG. 7 depicts a block diagram of an example system for implementing the techniques described herein.

FIG. 7 depicts a block diagram of an example system 700 for implementing the techniques discussed herein. In at least one example, the system 700 can include a vehicle(s) 202. In the illustrated example 700, the vehicle(s) 202 is an autonomous vehicle; however, the vehicle(s) 202 can be any other type of vehicle (e.g., a driver-controlled vehicle that may provide an indication of whether it is safe to perform various maneuvers).

The vehicle(s) 202 can include a computing device(s) 702, one or more sensor system(s) 704, one or more emitter(s) 706, one or more communication connection(s) 708 (also referred to as communication devices and/or modems), at least one direct connection 710 (e.g., for physically coupling with the vehicle(s) 202 to exchange data and/or to provide power), and one or more drive system(s) 712. The one or more sensor system(s) 704 can be configured to capture sensor data associated with an environment.

The sensor system(s) 704 can include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor system(s) 704 can include multiple instances of each of these or other types of sensors. For instance, the time-of-flight sensors can include individual time-of-flight sensors located at the corners, front, back, sides, and/or top of the vehicle(s) 202. As another example, the camera sensors can include multiple cameras disposed at various locations about the exterior and/or interior of the vehicle(s) 202. The sensor system(s) 704 can provide input to the computing device(s) 702.

The vehicle(s) 202 can also include one or more emitter(s) 706 for emitting light and/or sound. The one or more emitter(s) 706 in this example include interior audio and visual emitters to communicate with passengers of the vehicle(s) 202. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 706 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle(s) 202 can also include one or more communication connection(s) 708 that enable communication between the vehicle(s) 202 and one or more other local or remote computing device(s) (e.g., a remote teleoperations computing device) or remote services. For instance, the communication connection(s) 708 can facilitate communication with other local computing device(s) on the vehicle(s) 202 and/or the drive system(s) 712. Also, the communication connection(s) 708 can allow the vehicle(s) 202 to communicate with other nearby computing device(s) (e.g., other nearby vehicles, traffic signals, etc.).

The communications connection(s) 708 can include physical and/or logical interfaces for connecting the computing device(s) 702 to another computing device or one or more external network(s) 714 (e.g., the Internet). For example, the communications connection(s) 708 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s). In at least some examples, the communication connection(s) 708 may comprise the one or more modems as described in detail above.

In at least one example, the vehicle(s) 202 can include one or more drive system(s) 712. In some examples, the vehicle(s) 202 can have a single drive system 712. In at least one example, if the vehicle(s) 202 has multiple drive systems 712, individual drive systems 712 can be positioned on opposite ends of the vehicle(s) 202 (e.g., the front and the rear, etc.). In at least one example, the drive system(s) 712 can include one or more sensor system(s) 704 to detect conditions of the drive system(s) 712 and/or the surroundings of the vehicle(s) 202. By way of example and not limitation, the sensor system(s) 704 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders can be unique to the drive system(s) 712. In some cases, the sensor system(s) 704 on the drive system(s) 712 can overlap or supplement corresponding systems of the vehicle(s) 202 (e.g., sensor system(s) 704).

The drive system(s) 712 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 712 can include a drive system controller which can receive and preprocess data from the sensor system(s) 704 and to control operation of the various vehicle systems. In some examples, the drive system controller can include one or more processor(s) and memory communicatively coupled with the one or more processor(s). The memory can store one or more modules to perform various functionalities of the drive system(s) 712. Furthermore, the drive system(s) 712 also include one or more communication connection(s) that enable communication by the respective drive system with one or more other local or remote computing device(s).

The computing device(s) 702 can include one or more processor(s) 516 and memory 518 communicatively coupled with the one or more processor(s) 716. In the illustrated example, the memory 718 of the computing device(s) 702 stores a localization component 720, a perception component 722, a prediction component 724, a planning component 726, and one or more system controller(s) 728. Though depicted as residing in the memory 718 for illustrative purposes, it is contemplated that the localization component 720, the perception component 722, the prediction component 724, the planning component 726, and the one or more system controller(s) 728 can additionally, or alternatively, be accessible to the computing device(s) 702 (e.g., stored in a different component of vehicle(s) 202 and/or be accessible to the vehicle(s) 202 (e.g., stored remotely).

In memory 718 of the computing device(s) 702, the localization component 720 can include functionality to receive data from the sensor system(s) 704 to determine a position of the vehicle(s) 202. For example, the localization component 720 can include and/or request/receive a three-dimensional map of an environment and can continuously determine a location of the autonomous vehicle within the map. In some instances, the localization component 720 can use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, and the like to accurately determine a location of the autonomous vehicle. In some instances, the localization component 720 can provide data to various components of the vehicle(s) 202 to determine an initial position of an autonomous vehicle for generating a trajectory, as discussed herein.

The perception component 722 can include functionality to perform object detection, segmentation, and/or classification. In some examples, the perception component 722 can provide processed sensor data that indicates a presence of an entity that is proximate to the vehicle(s) 202 and/or a classification of the entity as an entity type (e.g., car, pedestrian, cyclist, building, tree, road surface, curb, sidewalk, unknown, etc.). In additional and/or alternative examples, the perception component 722 can provide processed sensor data that indicates one or more characteristics (also referred to as parameters) associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, a geographic position, an indication of darkness/light, etc.

The perception component 722 can include functionality to store perception data generated by the perception component 722. In some instances, the perception component 722 can determine a track corresponding to an object that has been classified as an object type. For purposes of illustration only, the perception component 722, using sensor system(s) 704 can capture one or more images of an environment. The sensor system(s) 704 can capture images of an environment that includes an object, such as a pedestrian. The pedestrian can be at a first position at a time T and at a second position at time T+t (e.g., movement during a span of time t after time T). In other words, the pedestrian can move during this time span from the first position to the second position. Such movement can, for example, be logged as stored perception data associated with the object.

The stored perception data can, in some examples, include fused perception data captured by the vehicle. Fused perception data can include a fusion or other combination of sensor data from sensor system(s) 704, such as image sensors, lidar sensors, radar sensors, time-of-flight sensors, sonar sensors, global positioning system sensors, internal sensors, and/or any combination of these. The stored perception data can additionally or alternatively include classification data including semantic classifications of objects (e.g., pedestrians, vehicles, buildings, road surfaces, etc.) represented in the sensor data. The stored perception data can additionally or alternatively include a track data (collections of historical positions, orientations, sensor features, etc. associated with the object over time) corresponding to motion of objects classified as dynamic objects through the environment. The track data can include multiple tracks of multiple different objects over time. This track data can be mined to identify images of certain types of objects (e.g., pedestrians, animals, etc.) at times when the object is stationary (e.g., standing still) or moving (e.g., walking, running, etc.). In this example, the computing device determines a track corresponding to a pedestrian.

The prediction component 724 can generate one or more probability maps representing prediction probabilities of possible locations of one or more objects in an environment. For example, the prediction component 724 can generate one or more probability maps for vehicles, pedestrians, animals, and the like within a threshold distance from the vehicle(s) 202. In some instances, the prediction component 724 can measure a track of an object and generate a discretized prediction probability map, a heat map, a probability distribution, a discretized probability distribution, and/or a trajectory for the object based on observed and predicted behavior. In some instances, the one or more probability maps can represent an intent of the one or more objects in the environment.

The planning component 726 can determine a path for the vehicle(s) 202 to follow to traverse through an environment. For example, the planning component 726 can determine various routes and paths and various levels of detail. In some instances, the planning component 726 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 726 can generate an instruction for guiding the autonomous vehicle along at least a portion of the route from the first location to the second location. In at least one example, the planning component 726 can determine how to guide the autonomous vehicle from a first waypoint in the sequence of waypoints to a second waypoint in the sequence of waypoints. In some examples, the instruction can be a path, or a portion of a path. In some examples, multiple paths can be substantially simultaneously generated (i.e., within technical tolerances) in accordance with a receding horizon technique. A single path of the multiple paths in a receding data horizon having the highest confidence level may be selected to operate the vehicle.

In other examples, the planning component 726 can alternatively, or additionally, use data from the perception component 722 to determine a path for the vehicle(s) 202 to follow to traverse through an environment. For example, the planning component 726 can receive data from the perception component 722 regarding objects associated with an environment. Using this data, the planning component 726 can determine a route to travel from a first location (e.g., a current location) to a second location (e.g., a target location) to avoid objects in an environment. In at least some examples, such a planning component 726 may determine there is no such collision free path and, in turn, provide a path which brings vehicle(s) 202 to a safe stop avoiding all collisions and/or otherwise mitigating damage.

In at least one example, the computing device(s) 702 can include one or more system controller(s) 728, which can be configured to control steering, propulsion, braking, safety, emitters, communication, and other systems of the vehicle(s) 202. These system controller(s) 728 can communicate with and/or control corresponding systems of the drive system(s) 712 and/or other components of the vehicle(s) 202, which may be configured to operate in accordance with a path provided from the planning component 726.

The vehicle(s) 202 can connect to computing device(s) 204 via network(s) 514 and can include one or more processor(s) 730 and memory 732 communicatively coupled with the one or more processor(s) 730. In at least one instance, the one or more processor(s) 730 can be similar to the processor(s) 716 and the memory 732 can be similar to the memory 718. In the illustrated example, the memory 732 of the computing device(s) 204 stores a scenario editor component 108, a parameter component 112, an error model component 116, a parameterized scenario component 120, a simulation component 124, an analysis component 128, and a vehicle performance component 130. Though depicted as residing in the memory 732 for illustrative purposes, it is contemplated that the scenario editor component 108, the parameter component 112, the error model component 116, the parameterized scenario component 120, the simulation component 124, the analysis component 128, and the vehicle performance component 130 can additionally, or alternatively, be accessible to the computing device(s) 204 (e.g., stored in a different component of computing device(s) 204 and/or be accessible to the computing device(s) 204 (e.g., stored remotely). The scenario editor component 108, the parameter component 112, the error model component 116, the parameterized scenario component 120, the simulation component 124, the analysis component 128, and the vehicle performance component 130 can be substantially similar to the scenario editor component 108, the parameter component 112, the error model component 116, the parameterized scenario component 120, the simulation component 124, the analysis component 128, and the vehicle performance component 130 of FIG. 1.

The processor(s) 716 of the computing device(s) 702 and the processor(s) 730 of the computing device(s) 204 can be any suitable processor capable of executing instructions to process data and perform operations as described herein. By way of example and not limitation, the processor(s) 716 and 730 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 718 computing device(s) 702 and the memory 732 of the computing device(s) 204 are examples of non-transitory computer-readable media. The memory 718 and 732 can store an operating system and one or more software applications, instructions, programs, and/or data to implement the methods described herein and the functions attributed to the various systems. In various implementations, the memory 718 and 732 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, in some instances, the components in the memory 718 and 732 can be implemented as a neural network.

Figure 8:
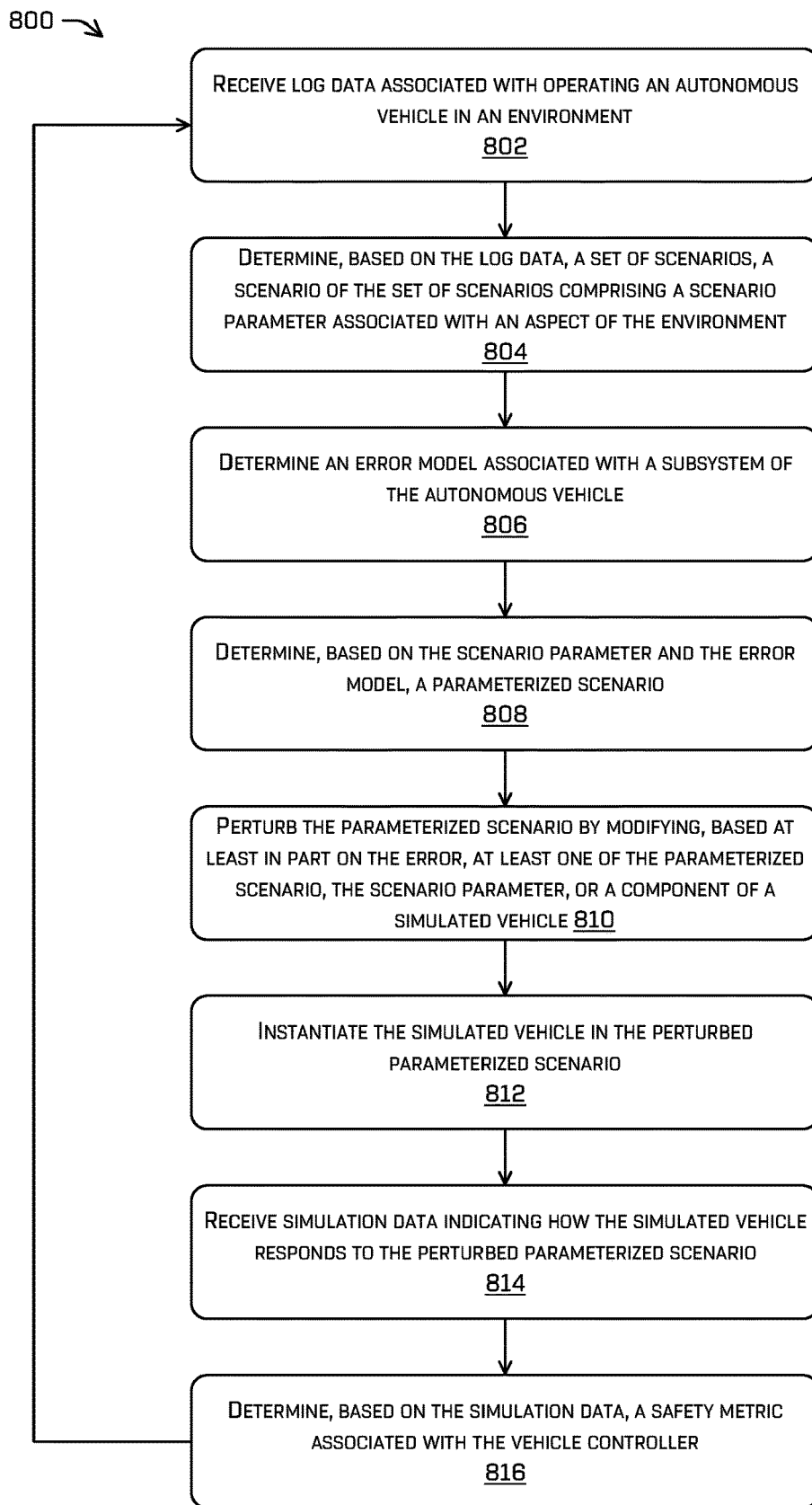
FIG. 8 depicts a flow diagram of an example process for determining a safety metric associated with a vehicle controller, in accordance with examples of the disclosure.

FIG. 8 depicts an example process 800 for determining a safety metric associated with a vehicle controller. Some or all of the process 800 can be performed by one or more components in FIGS. 1-7, as described herein. For example, some or all of the process 800 can be performed by the computing device(s) 204, and/or computing device(s) 702.

At operation 802 of example process 800, the process 800 can include receiving log data associated with operating in autonomous vehicle in an environment. In some instances, the log data can be generated by a vehicle(s) capturing, at least, sensor data of an environment.

At operation 804 of example process 800, the process 800 can include determining, based on the log data (or other data), a set of scenarios, a scenario of the set of scenarios comprising a scenario parameter associated with an aspect of the environment. In some instances, a computing device can group similar scenarios represented in the log data. For example, scenarios can be grouped together using, for example, k-means clustering and/or evaluating a weighted distance (e.g., Euclidian) between parameters of the environment. Additionally, the scenario parameter can represent an environmental parameter such as a night time environmental parameter or a wet conditions environmental parameter. In some instances, the scenario parameter can be associated with a vehicle or an object (e.g., a pose, a speed, etc.).

At operation 806 of example process 800, the process 800 can include determining an error model associated with a subsystem of the autonomous vehicle. An error model component can compare the vehicle data (e.g., log data) with the ground truth data to determine a difference between the vehicle data and the ground truth data. In some instances, the vehicle data can represent an estimated value associated with an object in an environment such as an estimated position, an estimated orientation, an estimated extent, and the like and the ground truth data can represent an actual position, an actual orientation, or an actual extent of the object. Based on the difference, the error model component can determine an error associated with a subsystem of a vehicle (e.g., a perception system, a tracking system, a prediction system, and the like).

At operation 808 of example process 800, the process 800 can include determining, based on the scenario parameter and the error model, a parameterized scenario. These can be combined to create a parameterized scenario that can cover the variations provided by the scenario parameter(s) and/or the error model. In some instances, the scenario parameter(s) can be randomly selected and combined to create the parameterized scenario. In some instances, the scenario parameter(s) can be combined based on a probability of occurring concurrently. By way of example and without limitation, log data can indicate that 5% of driving experiences include a pedestrian encounter and the parameterized scenario component can include a pedestrian as a scenario parameter in 5% of the parameterized scenarios generated by the parameterized scenario component. In some instances, the parameterized scenario component can verify a parameterized scenario to reduce unlikely or improbably combinations of scenario parameters. By way of example and without limitation, a vehicle would not be placed in a lake and a pedestrian would not be walking at a speed of 30 meters per second. As a non-limiting example, such a parameterized scenario may comprise ranges of distances, velocities, lighting conditions, weather conditions, etc. of a vehicle and a jaywalker in a particularly defined roadway having various Gaussian distributions (or other distributions) of error on the perception models, prediction models, etc. based at least in part on the scenario parameter(s).

At operation 810 of example process 800, the process 800 can include perturbing the parameterized scenario by modifying, based at least in part on the error, at least one of the parameterized scenario, the scenario parameter, or a component of a simulated vehicle. In some instances, an uncertainty can be associated with a scenario parameter. By way of example and without limitation, a position of an object can be associated with a 5% uncertainty causing an autonomous controller to traverse the environment while accounting for the 5% uncertainty. In some instances, a simulator can determine an error to incorporate into the simulation from the error model as the simulator executes the simulation.

At operation 812 of example process 800, the process 800 can include instantiating the simulated vehicle in the perturbed parametrized scenario. The simulator can use a simulated vehicle that can be associated with an autonomous controller and have the autonomous controller traverse the simulated environment. Instantiating the autonomous vehicle controller in the parameterized scenario and simulated the parameterized scenario can efficiently cover a wide range of variations of a scenario without requiring a manual enumeration of the variations. Additionally, based at least in part on executing the parameterized scenario, simulation data can indicate how the autonomous vehicle controller responded to the parameterized scenario and determine a successful outcome or an unsuccessful outcome based at least in part on the simulation data.

At operation 814 of example process 800, the process can include receiving simulation data indicating how the simulated vehicles responds to the perturbed parameterized scenario. After simulation, the result can indicate a pass (e.g., a successful outcome), a failure, and/or degrees of success or failure associated with the vehicle controller.

At operation 816 of example process 800, the process can include determining, based on the simulation data, a safety metric associated with the vehicle controller. For example, each simulation can result in a successful or an unsuccessful outcome. Additionally, as discussed above, a vehicle performance component can, based on the simulation data, determine vehicle performance data which can indicate how the vehicle performs in the environment. Based on sensitivity analysis, the vehicle performance data can indicate scenarios that where the result of the simulation was unsuccessful, a cause of the unsuccessful simulation, and/or bounds of the scenario parameters indicating values of a scenario parameter where the result of the simulation was successful. Therefore, the safety metric can indicate a passing/failing rate of the vehicle controller in a variety of simulated scenarios.

Figure 9:
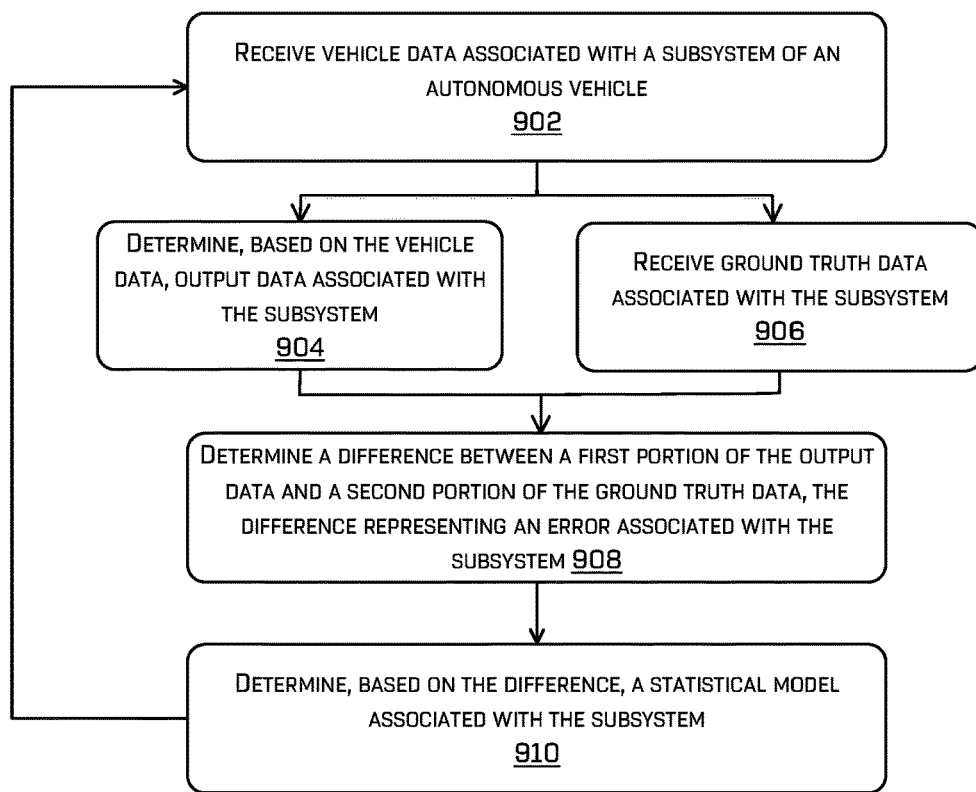
FIG. 9 depicts a flow diagram of an example process for determining a statistical model associated with a subsystem of an autonomous vehicle.

FIG. 9 depicts a flow diagram of an example process for determining a statistical model associated with a subsystem of an autonomous vehicle. Some or all of the process 900 can be performed by one or more components in FIGS. 1-7, as described herein. For example, some or all of the process 900 can be performed by the computing device(s) 204, and/or computing device(s) 702.

At operation 902 of example process 900, the process 900 can include receiving vehicle data (or other data) associated with a subsystem of an autonomous vehicle. The vehicle data can include log data captured by a vehicle traveling through an environment. In some instances, the vehicle data can include control data (e.g., data used to control systems such as steering, braking, and the like) and/or sensor data (e.g., lidar data, radar data, and the like).

At operation 904 of example process 900, the process 900 can include determining, based on the vehicle data, output data associated with the subsystem. By way of example and without limitation, the subsystem can be a perception system and the output data can be a bounding box associated with an object in the environment.

At operation 906 of example process 900, the process 900 can include receiving ground truth data associated with the subsystem. In some instances, the ground truth data can be manually labeled and/or determined from other, validated, machine-learned components. By way of example and without limitation, the ground truth data can include a validated bounding box that is associated with the object in the environment.

At operation 908 of example process 900, the process 900 can include determining a difference between a first portion of the output data and a second portion of the ground truth data, the difference representing an error associated with the subsystem. As discussed above, the output data can include a bounding box associated with the object in the environment as detected by a perception system of a vehicle and the ground truth data can include a validated bounding box associated with the object. A difference between the two bounding boxes can indicate an error associated with the perception system of the vehicle. By way of example and without limitation, the bounding box of the output data can be larger than the validated bounding box indicating that the perception system detects that the object is larger than in the environment.

At operation 910 of example process 900, the process 900 can include determining, based on the difference, a statistical model associated with the subsystem. For example,

EXAMPLE CLAUSES

A: A system comprising: one or more processors; and one or more computer-readable media storing computer-executable instructions that, when executed, cause the system to perform operations comprising: receiving log data associated with operating an autonomous vehicle in an environment; determining, based at least in part on the log data, a set of scenarios, a scenario of the set of scenarios comprising a scenario parameter associated with an aspect of the environment; determining an error model associated with a subsystem of the autonomous vehicle; determining, based at least in part on the scenario parameter and the error model, a parameterized scenario; perturbing the parameterized scenario by adding an error to at least one of the scenario parameter or a component of a simulated vehicle to be instantiated in a perturbed parameterized scenario, the simulated vehicle controlled by a vehicle controller; instantiating the simulated vehicle in the perturbed parameterized scenario; receiving simulation data indicating how the simulated vehicle responds to the perturbed parameterized scenario; and determining, based at least in part on the simulation data, a safety metric associated with the vehicle controller.

B: The system of paragraph A, wherein determining the set of scenarios comprises: clustering the log data to determine a first set of clusters, wherein an individual cluster of the first set of clusters is associated with an individual scenario; determining, based at least in part on the first set of clusters, a probability associated with the individual cluster; and determining, based at least in part on a probability threshold and the first set of clusters, a second set of clusters.

C: The system of paragraph A, wherein determining the error model comprises: receiving ground truth data associated with the environment; determining, based at least in part on comparing the ground truth data to the log data, an error; and determining, based at least in part on the error, an error distribution; wherein the error model comprises the error distribution.

D: The system of paragraph A, wherein the parameterized scenario is a first parameterized scenario, the perturbed parameterized scenario is a first perturbed parameterized scenario, and the simulation data is first simulation data, the operations further comprising: determining, based on the first simulation data, a second parameterized scenario comprising at least one of a first subset of the scenario parameter or a second subset of the error model; perturbing the second parameterized scenario as a second perturbed parameterized scenario; instantiating the simulated vehicle in the second perturbed parameterized scenario; receiving second simulation data; and updating, based at least in part on the second simulation data, the safety metric.

E: A method comprising: determining a scenario comprising a scenario parameter describing a portion of an environment; receiving an error model associated with a subsystem of a vehicle; determining, based at least in part on the scenario, the scenario parameter, and the error model, a parameterized scenario; perturbing the parameterized scenario as a perturbed parameterized scenario; receiving simulation data indicating how the subsystem of the vehicle responds to the perturbed parameterized scenario; and determining, based at least in part on the simulation data, a safety metric associated with the subsystem of the vehicle.

F: The method of paragraph E, wherein the scenario parameter is associated with at least one of an object size, an object velocity, an object pose, an object density, a vehicle velocity, a vehicle trajectory.

G: The method of paragraph E, wherein determining the scenario comprises: receiving log data associated with an autonomous vehicle; clustering the log data to determine a first set of clusters, wherein an individual cluster of the first set of clusters is associated with the scenario; determining, based at least in part on the first set of clusters, a probability associated with the individual cluster; and determining that the probability meets or exceeds a probability threshold.

H: The method of paragraph E, wherein the error model is determined based at least in part on: receiving ground truth data associated with the environment; determining, based at least in part on comparing the ground truth data to log data associated with a vehicle, an error; and determining, based at least in part on the error, an error distribution; wherein the error model comprises the error distribution.

I: The method of paragraph E, wherein the parameterized scenario is a first parameterized scenario, the perturbed parameterized scenario is a first perturbed parameterized scenario, and the simulation data is first simulation data, the method further comprising: determining, based on the first simulation data, a second parameterized scenario comprising at least one of a first subset of the scenario parameter or a second subset of the error model; perturbing the second parameterized scenario; receiving second simulation data; and updating, based at least in part on the second simulation data, the safety metric.

J: The method of paragraph I, further comprising: disabling at least a first portion of one of the scenario parameter or the error model; and associating the second simulation data with at least a second portion of one of the scenario parameter or the error model that is not disabled.

K: The method of paragraph E, wherein the safety metric indicates a probability of meeting or exceeding a cost threshold.

L: The method of paragraph E, wherein the portion is a first portion, the method further comprising: receiving map data, wherein a second portion of the map data is associated with the first portion of the environment; and determining that the second portion of the map data is associated with a scenario associated with a probability that meets or exceeds a threshold probability associated with the scenario parameter.

M: A non-transitory computer-readable medium storing instructions executable by a processor, wherein the instructions, when executed, cause the processor to perform operations comprising: determining a scenario comprising a scenario parameter describing a portion of an environment; one or more of receiving or determining an error model associated with a subsystem of a vehicle; determining, based at least in part on the scenario, the scenario parameter, and the error model, a parameterized scenario; perturbing the parameterized scenario as a perturbed parameterized scenario; receiving simulation data indicating how the subsystem of the vehicle responds to the perturbed parameterized scenario; and determining, based at least in part on the simulation data, a safety metric associated with the subsystem of the vehicle.

N: The non-transitory computer-readable medium of paragraph M, wherein the scenario parameter is associated with at least one of an object size, an object velocity, an object pose, an object density, a vehicle velocity, a vehicle trajectory.

O: The non-transitory computer-readable medium of paragraph M, wherein determining the scenario comprises: receiving log data associated with an autonomous vehicle; clustering the log data to determine a first set of clusters, wherein an individual cluster of the first set of clusters is associated with the scenario; determining, based at least in part on the first set of clusters, a probability associated with the individual cluster; and determining that the probability meets or exceeds a probability threshold.

P: The non-transitory computer-readable medium of paragraph M, wherein the error is determined based at least in part on: receiving ground truth data associated with the environment; determining, based at least in part on comparing the ground truth data to log data associated with a vehicle, an error; and determining, based at least in part on the error, an error distribution; wherein the error model comprises the error distribution.

Q: The non-transitory computer-readable medium of paragraph M, wherein the parameterized scenario is a first parameterized scenario, the perturbed parameterized scenario is a first perturbed parameterized scenario, and the simulation data is first simulation data, the operations further comprising: determining, based on the first simulation data, a second parameterized scenario comprising at least one of a first subset of the scenario parameter or a second subset of the error model; perturbing the second parameterized scenario; receiving second simulation data; and updating, based at least in part on the second simulation data, the safety metric.

R: The non-transitory computer-readable medium of paragraph Q, the operations further comprising: disabling at least a first portion of one of the scenario parameter or the error model; and associating the second simulation data with at least a second portion of one of the scenario parameter or the error model that is not disabled.

S: The non-transitory computer-readable medium of paragraph M, wherein the safety metric indicates a probability of meeting or exceeding a cost threshold.

T: The non-transitory computer-readable medium of paragraph M, wherein the error model is associated with one or more of a perception system of the vehicle, a prediction system of the vehicle, or a planner system of the vehicle.

U: A system comprising: one or more processors; and one or more computer-readable media storing computer-executable instructions that, when executed, cause the system to perform operations comprising: receiving vehicle data; inputting at least a first portion of the vehicle data into a subsystem of an autonomous vehicle, the subsystem associated with at least one of a perception system, a planning system, a tracking system, or a prediction system; determining, based at least in part on a second portion of the vehicle data, an environmental parameter; receiving, from the subsystem, an estimated value; receiving ground truth data associated with the subsystem; determining a difference between the estimated value and the ground truth data, the difference representing an error associated with the subsystem; and determining, based at least in part on the difference, a statistical model associated with the subsystem indicating a probability of the error, the probability associated with the environmental parameter.

V: The system of paragraph U, wherein the vehicle data comprises sensor data from a sensor on the autonomous vehicle, wherein the environmental parameter comprises one or more of a speed of the autonomous vehicle or a weather condition, and wherein the subsystem is a perception subsystem, the estimated value is one or more of an estimated position, estimated orientation, or estimated extent of an object represented in the vehicle data, and the ground truth data represents an actual position, actual orientation, or actual extents of the object.

W: The system of paragraph U, wherein determining the statistical model comprises: determining, based at least in part on the vehicle data, a first frequency associated with the environmental parameter and a second frequency associated with the difference; and determining, based at least in part on the first frequency and the second frequency, the probability.

X: The system of paragraph U, the operations further comprising: determining, based at least in part on simulated vehicle data, a simulated environmental parameter; determining the simulated environmental parameter corresponds to the environmental parameter; determining, based at least in part on the simulated vehicle data and the subsystem, a simulated estimated value; and perturbing, based at least in part on the probability, the simulated estimated value by altering a portion of a corresponding simulated scenario based at least in part on the error.

Y: A method comprising: receiving data associated with a vehicle; determining, based at least in part on a first portion of the data, an environmental parameter; determining, based at least in part on a second portion of the data, output data associated with a system of the vehicle; receiving ground truth data associated with the system and the data; determining a difference between the output data and a the ground truth data, the difference representing an error associated with the system; and determining, based at least in part on the difference, a statistical model associated with the system indicating a probability of the error, the probability associated with the environmental parameter.

Z: The method of paragraph Y, wherein determining the statistical model comprises: determining, based at least in part on the data, a frequency associated with the error.

AA: The method of paragraph Y, wherein the environmental parameter comprises one or more of a speed of the vehicle, a weather condition, a geographic position of the vehicle, or a time of day.

AB: The method of paragraph Y, further comprising: generating a simulation; determining a simulated environmental parameter of the simulation corresponds to the environmental parameter; inputting simulated data into the system; receiving, from the system, a simulated output; and perturbing, based at least in part on the probability and the error, the simulation.

AC: The method of paragraph Y, wherein the system is a perception system, the output data comprises a first bounding box associated with an object, the ground truth data comprises a second bounding box associated with the object, and wherein determining the difference comprises determining the difference between at least one of: a first extent of the first bounding box and a second extent of the second bounding box; or a first pose of the first bounding box and a second pose of the second bounding box.

AD: The method of paragraph Y, wherein the system is a tracker system, the output data comprises a planned trajectory data of the vehicle, the ground truth data comprises a measured trajectory of the vehicle, and wherein determining the difference comprises determining the difference between the planned trajectory data and the measured trajectory.

AE: The method of paragraph Y, wherein the system is associated with a prediction system, the data comprises a predicted trajectory of an object in an environment, the ground truth data comprises an observed trajectory of the object, and wherein determining the difference comprises determining the difference between the predicted trajectory and the observed trajectory.

AF: The method of paragraph Y, wherein the data is first data, the environmental parameter is a first environmental parameter, the difference is a first difference, the error is a first error, and the probability is a first probability, the method further comprising: receiving second data associated with the system of the vehicle; determining, based at least in part on the second data, a second environmental parameter; determining a second difference between a third portion of the output data and a fourth portion of the ground truth data, the second difference representing a second error associated with the system; and updating the statistical model associated with the system, the statistical model indicating a second probability of the second error, the second probability associated with the second environmental parameter.

AG: A non-transitory computer-readable medium storing instructions executable by a processor, wherein the instructions, when executed, cause the processor to perform operations comprising: receiving data; determining, based at least in part on the data, an environmental parameter; determining, based at least in part on the data and a system of a vehicle, output data; receiving ground truth data associated the system and the data; determining a difference between a first portion of the output data and a second portion of the ground truth data, the difference representing an error associated with the system; determining, based at least in part on the difference, a statistical model associated with the system indicating a probability of the error; and associating the probability with the environmental parameter.

AH: The non-transitory computer-readable medium of paragraph AG, wherein determining the statistical model comprises: determining, based at least in part on the data, a frequency associated with the difference.

AI: The non-transitory computer-readable medium of paragraph AG, wherein the environmental parameter comprises one or more of a speed of the vehicle, a weather condition, or a time of day.

AJ: The non-transitory computer-readable medium of paragraph AG, the operations further comprising: generating a simulation comprising a simulated vehicle; receiving simulated data; determining a simulated environmental parameter corresponds to the environmental parameter; inputting at least a portion of the simulated data into the system; receiving, from the system, simulated output data; and altering, based at least in part on a request and the probability and the error, the simulated output data.

AK: The non-transitory computer-readable medium of paragraph AG, wherein the system is a perception system, the data comprises a first bounding box associated with an object, the ground truth data comprises a second bounding box associated with the object, and wherein determining the difference comprises determining the difference between at least one of: a first extent of the first bounding box and a second extent of the second bounding box; or a first pose of the first bounding box and a second pose of the second bounding box.

AL: The non-transitory computer-readable medium of paragraph AG, wherein the system is a tracker system, the data comprises a planned trajectory data of the vehicle, the ground truth data comprises a measured trajectory of the vehicle, and wherein determining the difference comprises determining the difference between the planned trajectory data and the measured trajectory.

AM: The non-transitory computer-readable medium of paragraph AG, wherein the system is associated with a prediction system, the data comprises a predicted trajectory of an object in an environment, the ground truth data comprises an observed trajectory of the object, and wherein determining the difference comprises determining the difference between the predicted trajectory and the observed trajectory.

AN: The non-transitory computer-readable medium of paragraph AG, wherein the data is first data, the environmental parameter is a first environmental parameter, the difference is a first difference, the error is a first error, and the probability is a first probability, the operations further comprising: receiving second data associated with the system of the vehicle; determining, based at least in part on the second data, a second environmental parameter; determining a second difference between a third portion of the output data and a fourth portion of the ground truth data, the second difference representing a second error associated with the system; and updating the statistical model associated with the system, the statistical model indicating a second probability of the second error, the second probability associated with the second environmental parameter.

While the example clauses described above are described with respect to one particular implementation, it should be understood that, in the context of this document, the content of the example clauses can also be implemented via a method, device, system, computer-readable medium, and/or another implementation. Additionally, any of examples A-AN may be implemented alone or in combination with any other one or more of the examples A-AN.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system comprising:
one or more processors; and
one or more computer-readable media storing computer-executable instructions that, when executed, cause the system to perform operations comprising:
receiving log data associated with operating an autonomous vehicle in an environment;
determining, based at least in part on the log data, a set of scenarios, a scenario of the set of scenarios comprising a scenario parameter associated with an aspect of the environment;
determining a plurality of error models associated with a subsystem of the autonomous vehicle, an individual error model of the plurality of error models indicating an error and an error distribution associated with the subsystem of the autonomous vehicle;
identifying, based at least in part on the scenario parameter, an error model of the plurality of error models;
determining, based at least in part on the scenario parameter and the error model, a parameterized scenario, wherein the parameterized scenario represents a possible variation of the scenario;
perturbing the parameterized scenario by adding an error indicated by the error model to at least one of a component of a simulated vehicle to be instantiated in a perturbed parameterized scenario or the scenario parameter, the simulated vehicle being controlled by a vehicle controller;
instantiating the simulated vehicle in the perturbed parameterized scenario;
receiving simulation data indicating how the simulated vehicle responds to the perturbed parameterized scenario; and
determining, based at least in part on the simulation data, a safety metric associated with the vehicle controller, wherein the safety metric represents an outcome associated with the parameterized scenario.

2. The system of claim 1, wherein determining the set of scenarios comprises:
clustering the log data to determine a first set of clusters, wherein an individual cluster of the first set of clusters is associated with an individual scenario;
determining, based at least in part on the first set of clusters, a probability associated with the individual cluster; and
determining, based at least in part on a probability threshold and the first set of clusters, a second set of clusters.

3. The system of claim 1, wherein determining the plurality of error models comprises:
receiving ground truth data associated with the environment;
determining, based at least in part on comparing the ground truth data to the log data, an error; and
determining, based at least in part on the error, an error distribution.

4. The system of claim 1, wherein the parameterized scenario is a first parameterized scenario, the perturbed parameterized scenario is a first perturbed parameterized scenario, and the simulation data is first simulation data, the operations further comprising:
determining, based on the first simulation data, a second parameterized scenario comprising at least one of a first subset of the scenario parameter or a second subset of the error model;

perturbing the second parameterized scenario as a second perturbed parameterized scenario;
instantiating the simulated vehicle in the second perturbed parameterized scenario;
receiving second simulation data; and
updating, based at least in part on the second simulation data, the safety metric.

5. A method comprising:
determining a scenario comprising a scenario parameter describing a portion of an environment;
receiving a plurality of error models associated with a subsystem of a vehicle;
identifying, based at least in part on the scenario parameter, an error model of the plurality of error models;
determining, based at least in part on the scenario, the scenario parameter, and the error model, a parameterized scenario, wherein the parameterized scenario represents a possible variation of the scenario;
perturbing the parameterized scenario as a perturbed parameterized scenario by adding an error indicated by the error model;
receiving simulation data indicating how the subsystem of the vehicle responds to the perturbed parameterized scenario; and
determining, based at least in part on the simulation data, a safety metric associated with the subsystem of the vehicle, wherein the safety metric represents an outcome associated with the parameterized scenario.

6. The method of claim 5, wherein the scenario parameter is associated with at least one of an object size, an object velocity, an object pose, an object density, a vehicle velocity, a vehicle trajectory.

7. The method of claim 5, wherein determining the scenario comprises:
receiving log data associated with an autonomous vehicle;
clustering the log data to determine a first set of clusters, wherein an individual cluster of the first set of clusters is associated with the scenario;
determining, based at least in part on the first set of clusters, a probability associated with the individual cluster; and
determining that the probability meets or exceeds a probability threshold.

8. The method of claim 5, wherein the error model is identified based at least in part on:
receiving ground truth data associated with the environment;
determining, based at least in part on comparing the ground truth data to log data associated with the vehicle, an error; and
determining, based at least in part on the error, an error distribution;
wherein the error model comprises the error distribution.

9. The method of claim 5, wherein the parameterized scenario is a first parameterized scenario, the perturbed parameterized scenario is a first perturbed parameterized scenario, and the simulation data is first simulation data, the method further comprising:
determining, based on the first simulation data, a second parameterized scenario comprising at least one of a first subset of the scenario parameter or a second subset of the error model;
perturbing the second parameterized scenario;
receiving second simulation data; and
updating, based at least in part on the second simulation data, the safety metric.

10. The method of claim 9, further comprising:
disabling at least a first portion of one of the scenario parameter or the error model; and
associating the second simulation data with at least a second portion of one of the scenario parameter or the error model that is not disabled.

11. The method of claim 5, wherein the portion is a first portion, the method further comprising:
receiving map data, wherein a second portion of the map data is associated with the first portion of the environment; and
determining that the second portion of the map data is associated with a scenario associated with a probability that meets or exceeds a threshold probability associated with the scenario parameter.

12. A non-transitory computer-readable medium storing instructions executable by a processor, wherein the instructions, when executed, cause the processor to perform operations comprising:
determining a scenario comprising a scenario parameter describing a portion of an environment;
one or more of receiving or determining a plurality of error models associated with a subsystem of a vehicle;
identifying, based at least in part on the scenario parameter, an error model of the plurality of error models;
determining, based at least in part on the scenario, the scenario parameter, and the error model, a parameterized scenario, wherein the parameterized scenario represents a possible variation of the scenario;
perturbing the parameterized scenario as a perturbed parameterized scenario by adding an error indicated by the error model;
receiving simulation data indicating how the subsystem of the vehicle responds to the perturbed parameterized scenario; and
determining, based at least in part on the simulation data, a safety metric associated with the subsystem of the vehicle, wherein the safety metric represents an outcome associated with the parameterized scenario.

13. The non-transitory computer-readable medium of claim 12, wherein the scenario parameter is associated with at least one of an object size, an object velocity, an object pose, an object density, a vehicle velocity, a vehicle trajectory.

14. The non-transitory computer-readable medium of claim 12, wherein determining the scenario comprises:
receiving log data associated with an autonomous vehicle;
clustering the log data to determine a first set of clusters, wherein an individual cluster of the first set of clusters is associated with the scenario;
determining, based at least in part on the first set of clusters, a probability associated with the individual cluster; and
determining that the probability meets or exceeds a probability threshold.

15. The non-transitory computer-readable medium of claim 12, wherein the error model is identified based at least in part on:
receiving ground truth data associated with the environment;
determining, based at least in part on comparing the ground truth data to log data associated with the vehicle, an error; and
determining, based at least in part on the error, an error distribution;
wherein the error model comprises the error distribution.

16. The non-transitory computer-readable medium of claim 12, wherein the parameterized scenario is a first parameterized scenario, the perturbed parameterized scenario is a first perturbed parameterized scenario, and the simulation data is first simulation data, the operations further comprising:
- determining, based on the first simulation data, a second parameterized scenario comprising at least one of a first subset of the scenario parameter or a second subset of the error model;
- perturbing the second parameterized scenario;
- receiving second simulation data; and
- updating, based at least in part on the second simulation data, the safety metric.

17. The non-transitory computer-readable medium of claim 16, the operations further comprising:
- disabling at least a first portion of one of the scenario parameter or the error model; and
- associating the second simulation data with at least a second portion of one of the scenario parameter or the error model that is not disabled.

18. The non-transitory computer-readable medium of claim 12, wherein the safety metric indicates a probability of meeting or exceeding a cost threshold.

19. The non-transitory computer-readable medium of claim 12, wherein the error model is associated with one or more of a perception system of the vehicle, a prediction system of the vehicle, or a planner system of the vehicle.

20. The method of claim 5, further comprising:
- determining the parameterized scenario further based at least in part on a scenario probability representing a probability of encountering the scenario in the environment.

* * * * *